(12) United States Patent
Duff, Jr.

(10) Patent No.: US 7,289,312 B2
(45) Date of Patent: Oct. 30, 2007

(54) ELECTRICAL CHARGES STORAGE DEVICE HAVING ENHANCED POWER CHARACTERISTICS

(76) Inventor: William B. Duff, Jr., 22 Shilo Rd., Odessa, TX (US) 79672

( * ) Notice: Subject to any disclaimer, the term of this patent is extended or adjusted under 35 U.S.C. 154(b) by 28 days.

(21) Appl. No.: 10/793,638

(22) Filed: Mar. 4, 2004

(65) Prior Publication Data

US 2004/0175561 A1 Sep. 9, 2004

Related U.S. Application Data

(60) Provisional application No. 60/452,266, filed on Mar. 5, 2003.

(51) Int. Cl.
*H01G 9/00* (2006.01)
(52) U.S. Cl. ............. 361/502; 361/503; 361/504; 361/508; 361/512
(58) Field of Classification Search ........ 361/502–504, 361/508–519, 523–528; 429/247, 254, 15, 429/17, 33
See application file for complete search history.

(56) References Cited

U.S. PATENT DOCUMENTS

| | | | | |
|---|---|---|---|---|
| 4,228,481 | A * | 10/1980 | DiNicola et al. | ............ 361/314 |
| 4,730,239 | A * | 3/1988 | Currie et al. | ............... 361/502 |
| 5,081,559 | A | 1/1992 | Fazan et al. | |
| 5,362,526 | A | 11/1994 | Wang et al. | |
| 5,453,909 | A * | 9/1995 | Kobayashi | .................. 361/502 |
| 5,545,466 | A | 8/1996 | Saida et al. | |
| 5,705,259 | A | 1/1998 | Mrotek et al. | |
| 5,711,988 | A | 1/1998 | Tsai et al. | |
| 5,876,787 | A | 3/1999 | Avarbz et al. | |
| 6,021,039 | A * | 2/2000 | Inagawa | ..................... 361/502 |
| 6,226,173 | B1 | 5/2001 | Welsch et al. | |
| 6,320,741 | B1 * | 11/2001 | Ohya et al. | ................. 361/502 |
| 6,426,862 | B1 * | 7/2002 | Vasechkin et al. | .......... 361/502 |
| 7,042,708 | B1 * | 5/2006 | Borisenko et al. | ......... 361/502 |
| 2001/0006449 | A1 | 7/2001 | Chazono | |
| 2002/0017893 | A1 | 2/2002 | Duff, Jr. | |
| 2003/0006738 | A1 | 1/2003 | Duff, Jr. | |

(Continued)

FOREIGN PATENT DOCUMENTS

GB 1083575 9/1967

(Continued)

OTHER PUBLICATIONS

Economic AC Capacitors, W. B. Duff, Jr., IEEE Power Engineering Review, vol. 22, No. 1, Jan. 2002, The Institute of Electrical and Electronics Engineers, NYNY.

(Continued)

*Primary Examiner*—Nguyen T. Ha
(74) *Attorney, Agent, or Firm*—Fulbright & Jaworski L.L.P.

(57) ABSTRACT

The present invention relates generally to an electrical charge storage device (ECSD) with enhanced power characteristics. More particularly, the present invention relates to enhancing the current density, voltage rating, power transfer characteristics, frequency response and charge storage density of various devices, such as capacitors, batteries, fuel cells and other electrical charge storage devices. For example, one aspect of the present invention is solid state and electrolytic capacitors where the conductor surface area is increased with smooth structures, thereby reducing the distance separating the conductors, and improving the effective dielectric characteristics by employing construction techniques on atomic, molecular, and macroscopic levels.

65 Claims, 6 Drawing Sheets

U.S. PATENT DOCUMENTS

2003/0010910 A1    1/2003    Colbert et al.

FOREIGN PATENT DOCUMENTS

| | | |
|---|---|---|
| GB | 2069240 | 8/1981 |
| JP | 02063106 | 3/1990 |
| JP | 03257856 | 11/1991 |
| JP | 3295214 | 12/1991 |
| JP | 11340430 | 12/1999 |
| JP | 2000058781 | 2/2000 |

OTHER PUBLICATIONS

Solid State Electronic Devices, 3rd Edition, Ben G. Streetman, Prentice-Hall, Englewood Cliffs, NJ, 1990.

* cited by examiner

Side View

Top View

Sinusoidal Topology

ELECTRICAL CHARGES STORAGE DEVICE HAVING ENHANCED POWER CHARACTERISTICS

RELATED APPLICATIONS

This application claim priority to U.S. provisional patent application Ser. No. 60/452,266, filed Mar. 5, 2003.

TECHNICAL FIELD

The present invention relates generally to an electrical charge storage device (ECSD) with enhanced power characteristics. More particularly, the present invention relates to enhancing the current density, voltage rating, power transfer characteristics, frequency response and charge storage density of various devices, such as capacitors, batteries, fuel cells and other electrical charge storage devices. For example, one aspect of the present invention is solid state and electrolytic capacitors where the conductor surface area is increased with smooth structures, thereby reducing the distance separating the conductors, and improving the effective dielectric characteristics by employing construction techniques on atomic, molecular, and macroscopic levels.

BACKGROUND OF THE INVENTION

Electrical capacitors are electrical charge storage devices composed generally of a pair of conductors separated by a dielectric material. Capacitors may be used in both direct current (DC) and alternating current (AC) applications for a variety of purposes, including energy storage, signal coupling, motor starting, motor running, power factor correction, voltage regulation, VA efficiency, tuning, resonance, surge suppression, and filtration. In either AC or DC networks, capacitors may be arranged in series, shunt, and hybrid configurations to provide many operational advantages, both transient and steady state. For example, shunt capacitors can serve as current sources or voltage sources in both AC and DC applications and provide VAR support and power factor correction in AC applications.

In transient AC networks, capacitors can be used to improve power factor during transient conditions, which results in increased efficiency or other desirable enhancements. Transient applications of series capacitors include voltage surge protection, motor starting, current limiting, switching operations, and the like. For example, low power factor transient currents are associated with fault currents and inrush currents due to motor starting and transformer magnetization. Series capacitors can moderate these effects by improving overall power factor and network voltage regulation during the transient condition. In addition, series capacitance can provide a degree of current limiting during transient conditions as a result of the series impedance of the capacitor, thus reducing the magnitude of fault currents and, as a result, reducing generator, transformer, switchgear, bus and transmission line requirements. Further, mechanical stress associated with bringing additional generation capacity on line can be moderated by the presence of series capacitive coupling. While these and many other series capacitor advantages are well known, unit cost, size requirements, voltage limitations, current limitations, dv/dt limitations, di/dt limitations, insulation limitations, dielectric limitations, electromechanical limitations and thermodynamic limitations, have prevented widespread implementation of series capacitors, especially in low frequency applications.

Steady state AC network characteristics also can be improved through the incorporation of capacitors. For example, high capacitance, series applications impress a low steady state AC voltage on the capacitor, which can be beneficial when electrical transfer devices are used in conjunction with series capacitor banks. Similarly, electrical wave distortion can be reduced by altering capacitance. Certain electrical circuit parameters are optimized through impedance matching or detuning of series capacitors. Other circuits can be enhanced by the use of capacitors to provide current limiting and/or voltage division. Steady state series capacitor applications include motor running, filtration, power factor correction, efficient power transfer, voltage boosting, and the like. Series, shunt and hybrid capacitor arrangements can be employed to enhance motor torque, speed, efficiency, power, power factor, VA efficiency, coupling and the like. Various capacitor bank and motor winding configurations can also allow induction generators to power induction motors by providing the required magnetizing currents for both devices. In such an application, power quality can be improved, while reducing the cost of electric grid alternative sources, emergency power supplies, mobile equipment, and portable generators. Further, operational variation of capacitance and capacitive reactance can be used to enhance electrical network steady state performance.

The characteristics of DC networks also can be improved through the use of capacitors. In DC networks, capacitors can be used to moderate rapid changes in DC network voltage, to store energy for sudden increases in demand, and to absorb energy when the DC network is subjected to sudden increases in source current or decreases in load current. Capacitors are used to block DC. They are further employed to couple signals in predominantly DC applications and in resonant DC links. However, low ratios of instantaneous and steady state power capability to total stored energy tend to limit the operating utility of capacitors in DC applications. High ESR and overheating often limit the utility of conventional capacitor selections such as electrolytic capacitance in DC and signal coupling applications.

Capacitors typically are categorized as either non-polar or polar; and there are many realizations of each category. Non-polarized capacitors generally are useful in both DC and AC applications. Unfortunately, non-polarized capacitors-especially in series configurations-are not well-suited for many AC and DC applications due to limitations in size, capacitance, weight, efficiency, energy density, and cost. Singular polarized capacitors traditionally have been limited to use in DC and small AC signal coupling applications due to their unidirectional, forward biasing requirements. In addition, anti-series polarized capacitors can be used in transient applications, such as motor starting, and forwardly biased anti-series polarized capacitors can be continuously operated in AC applications. In DC applications, polarized capacitors are widely used for filtering, such as in the output stage of DC power supplies. Polarized capacitors are also used to couple signals between amplifier stages. Finally, polarized capacitors have historically been used as rectifiers.

Non-polarized capacitors commonly are constructed of two conductors separated by a dielectric or insulator. The conductors typically are made of a conductive material, such as copper, aluminum, other metal, or doped semiconductor. The dielectric or insulator may be composed of air, mica, oil, paper, plastic or other compound. Non-polarized capacitors also may be constructed as metalized film capacitors which are composed of a thin layer of plastic having metalized surfaces. The capacitance of non-polarized capacitors generally is limited by the surface area of the discrete conductors, the distance separating the conductors, and the dielectric constant. The rated voltage of such capacitors is limited by the dielectric constant, dielectric strength, and material and fabrication defects. The current and rate of change of current (i.e., di/dt) is limited by the, ESR, mechanical strength and thermodynamic properties of the particular capacitor materials and structure. Metalized film capacitors routinely short at points of minimum dielectric thickness. The subsequent burn through or fault clearing is sometimes referred to as self healing. Perhaps progressive self destruction would be a more accurate description of this behavior. The failure mechanism of shorting and then burn through can be disruptive in sensitive circuits such as digital devices. Further, metalized film capacitors tend to poorly dissipate heat. This creates internal hot spots and tends to accelerate capacitor failure.

Parallel-plate-type capacitors generally constitute the most common commercial realizations of the non-polarized capacitor. In such implementations, dielectric breakdown and failure of such capacitor embodiments often are associated with concentrations of charge accumulations at corners and sharp points of the conductive plates and material defects and variation of thickness in high electric field conditions. Although the capacitor can be designed and the dielectric material chosen such that the capacitor theoretically should withstand such conditions, conventional macroscopic manufacturing methods often do not provide the accuracy and control needed to ensure that the fabricated capacitor can perform at its theoretical capability. For example, conventional techniques cannot ensure that sharp corners or burrs on the conductors will be avoided, or that the thickness of the dielectric material will be uniform throughout its area, or that the dielectric will be disposed on the conductors in a conformal manner. Further the surface area of parallel-plate-type capacitors has been generally limited to flat place construction and conventional enhancement techniques such as plate sharing and spiral wound packaging.

Polarized capacitors have enhanced surface area as compared to non-polarized capacitors, which, unfortunately, introduces additional capacitor components, a charge transport mechanism, and additional losses. For example, the physical composition of one commonly used polarized capacitor—an electrolytic capacitor—includes a conductor, anode foil, anodized layers, liquid impregnated paper layer, insulation paper layer, cathode, and conductor. The construction methods and loss mechanisms for other polarized devices. (symmetric and asymmetric) such as super capacitors, ultra capacitors and double layer capacitors are similarly well known. However, polarized capacitors (as well as other polarized electric charge storage (PECS) devices), generally have a low cost per unit of capacitance and smaller mass and dimensions as compared with their non-polarized counterparts. These characteristics favor the use of polarized capacitors over non-polarized capacitors.

Despite these advantageous properties, polarized capacitors also have their drawbacks. The electrically directional capacitance versus rectification circuit behavior due to electron tunneling is often disadvantageous. As another example, polarized capacitors exhibit a higher equivalent series resistance (ESR) at power frequencies than the non-polarized type due to the resistance of the paper/electrolyte and power losses in the oxide (i.e., dielectric) layer. Further, electrolytic capacitors outgas hydrogen due to the electrolysis of water, and ion transport limitations and conductor termination practices tend to contribute to a steep frequency response curve. Still further, the maximum AC ripple current that can be tolerated by electrolytic capacitors is limited by the ESR, rated voltage and the thermodynamic, mechanical, and venting properties of the capacitor package that allow it withstand the resultant heat and pressure buildup without rupturing. Further, the most commonly used material, aluminum, requires great energy to refine conventionally. The anode etching and forming process then requires additional large inputs of energy, chemical processing and handling. Other conventionally constructed polarized charge storage devices suffer innumerable similar disadvantages.

Certain known methods exist for improving the thermodynamic properties of polarized capacitors. These methods include increasing thermal mass by increasing foil thickness, increasing fluid volume and the use of thicker can material. It is also possible to increase heat dissipation by reducing the thermal resistance to heat flow. This is accomplished by such methods as crimping the cathode foil to the can, increasing the surface area of the can internally and externally and creating additional thermal structures such as cold fingers, headers and stud mounting. Another known methods include increased air flow, circulating fluid and other external heat control methods. Finally increased radiation and conduction can be achieved by means of increasing the capacitor allowable operating temperature. These methods, though somewhat effective tend to increase costs substantially and in many cases substantially increase the physical size and weight of the components.

Typically, for both polarized and non-polarized discrete capacitors, neither the theoretical dielectric strength nor the theoretical dielectric constant, have been effectively realized due to material imperfections, imprecise manufacturing processes, and boundary interface problems. These factors, in turn, limit both the maximum rated device voltage and capacitance that may be attained for a given capacitor implementation. Still further, imbalances in conduction current and displacement current capabilities combined with inconsistent material properties limit the transient and sustained current capabilities for a given capacitor. Structural thermodynamic limitations further tend to limit transient and steady state electrical current capabilities and capacitor operational lifetime. Accordingly, there is a need to provide improved capacitors and methods for fabricating capacitors that result in increased capacitance, voltage and current ratings, and power delivery.

It is well known that capacitance in flat plate capacitors is governed by the following equation:

$$C = E_0 E_R A / d$$

where $E_0$ is the permittivity of free space, $E_R$ is the relative permittivity of the dielectric, A is the common surface area of the conductors, and d represents the distance between conductors. From the foregoing equation, it can be seen that capacitance can be increased by increasing the common surface area A of the conductors. FIG. 1 shows an instantaneous charge accumulation on the conductor plates 10 and 11 of a generalized capacitor 15 having a planar surface for the conductive layers. Microscopic charge displacement in the dielectric allows current flow. Positive and negative charges are shown. A dielectric layer 13 is disposed between the conductor plates 10 and 11.

An example of a known technique for increasing surface area can be seen in FIG. 2, which represents a magnified cross-sectional view of an exemplary embodiment of a polarized electrolytic capacitor 20 having conductor foils 22 and 24. The surface area of the foils 22 and 24 is increased by acid etching the conductors such that microchannels 26 are formed. The microchannels 26 typically are on the order of 40 µm by 1 µm and have sharp edges. The high purity aluminum anode 22 is oxidized by known large scale fabrication methods to create a thin film of aluminum oxide in either crystalline, polycrystalline or amorphous form to create a dielectric layer 28 having a relative dielectric constant $E_R$ of approximately 9. The insulation rating, corresponding to such a dielectric constant is generally; on the order of 1.1 nM/V.

It can be seen from FIG. 2 that the effective surface area of the conductor foils is increased substantially as a result of the broom-straw-like structure. However, it is difficult to charge the capacitor, particularly at high voltages due to spatial distance variations between the extremities of the broom-straw-like structures and the attendant displacement current limitations. To remedy this inherent weakness, an additional charge transport mechanism is introduced in the form of a paper wet with an electrolytic solution to provide a pathway for electrical charges to reach the enhanced surface area of the conductor during the charging process.

The configuration illustrated in FIG. 2 has many characteristics which ultimately limit the performance and longevity of the capacitor. For example, negative ions, which travel from the cathode foil to the anode foil through the wetted paper during the charging process, increase the ESR of the capacitor and limit ripple current ratings. Hydrogen gas emitted during the charging process due to the electrolysis of water must be vented. Mechanical weakness of the structure and required anodization thickness limit capacitor rated voltage. And, although the microchannels serve to increase the surface area of the conductors, the effect of this enhancement is reduced from two orders of magnitude to one order of magnitude as rated voltages are increased.

Another drawback to aluminum electrolytic capacitors is the enormous quantity of energy required for fabrication. Aluminum has been referred to as congealed electricity. The energy required for high purity aluminum, such as required for anodic foil is greater still. Conventional manufacturing typically requires processing with first strong alkaline and then strong acid chemical baths in an impressed electrical field. Several washes of high purity water are also required. Great amounts of electrical power are required for heating, oxidizing and forming the aluminum foil and tab materials. The electrolyte solution is often a petrochemical such as ethylene glycol mixed with water and other chemicals such as acids or bases. Winding, wetting and stuffing operations are followed by final electrical formation steps. These steps and inputs are highly energy intensive. Thus, conventional manufacturing techniques for aluminum electrolytic capacitors require a substantial quantity of energy.

Anti-series pairs of polarized capacitors suffer from several disadvantages. First if the pair is unbiased, one device acts as a capacitor while the other component acts as a diode. This operating condition alternates every half cycle and greatly shortens capacitor assembly life and is a source of electrical harmonic current and ground reference voltage disturbances. When equal size, anti-series capacitors are biased, the capacitance of the assembly is cut approximately in half. ESR and related high dissipation factor are increased for the assembly, as they are series additive electrical phenomena.

Small-scale manufacturing techniques also are known for fabricating capacitors. For example, semiconductor manufacturing techniques are used to create capacitors in solid state integrated circuit devices. Because an object of integrated circuit memory designs is to create short half life circuits at low voltages, such designs focus on reducing capacitance often and favor lower dielectric constants rather than increasing capacitance and enhancing power delivery characteristics. Where high dielectric constants and current density have been favored in these applications the purpose is generally in pursuit of miniaturization and ever lower capacitance. Decoupling capacitors act as localized, low impedance voltage sources; thus furnishing noise free power to synchronous integrated circuits. Printed circuit board electrical, thermal and mechanical limitations severely limit integrated capacitor materials and construction techniques. Also integrated capacitance variation cannot be easily controlled using conventional manufacturing techniques.

Other polarized electrical charge storage device research has revolved around increasing total energy storage and has resulted in the development of super capacitors, ultra capacitors or double layer capacitors. Such capacitors are intended to bridge the gap between electrochemical batteries and polarized capacitors, such as liquid tantalum and aluminum electrolytic capacitors. Energy storage capability is increased in super, ultra and double layer capacitors by enhancing conductor surface area and volume charge storage capabilities by large-scale manufacturing techniques such as those described in U.S. Pat. No. 5,876,787, entitled "Process of Manufacturing a Porous Carbon Material and Capacitor having the Same."

Super capacitors, ultra capacitors and double layer capacitors, however, have many limiting characteristics which inhibit their usefulness for power applications. For example, such capacitors have relatively low voltage ratings (i.e., 1V-3V per cell) and tend to have relatively high ESR, both of which are not positive attributes in applications having power transfer as an object. Further, the devices are polarized charge storage devices, thus restricting their usefulness in AC power applications. Further, such devices often fail to deliver the full charge stored on demand. A great deal of the stored charge can remain unavailable. This observed characteristic has a time dependant component and a time invariant component. Not all the stored energy which can be put to use, can be released instantaneously, making the devices less suitable for rapid rate charge and discharge applications. The second mechanism by which the stored charge remains unavailable for convenient use is the phenomenon of trapped energy. Series assemblies comprised of capacitors of various sizes and charge levels will retain a significant and measurable voltage trapped within, at the end of discharge. The low cell voltages of super, ultra and double layer capacitors require many cells to achieve common system voltages. This phenomenon can also be observed in electrochemical battery discharges and is sometimes referred to as cell inversion.

Improvements in power delivery and end use systems can have a significant impact on today's economy and environment. More particularly, electrical motors presently consume about 65% of metered real power. To illustrate the improvements that can be realized, assume that an example motor has a 50% power factor and that the remaining 35% of metered load is purely resistive. Thus, the total Volt-Amps (VA) of the combined load is 119.27% of the real power, and the 35% resistive load is only 29.24% of the total VA load. Accordingly, the motor load in this example is greater than 70.75% of the system total VA load. Capacitors arranged in series, shunt, and hybrid configurations can help economically to correct motor power factor and reduce the economic and environmental consequences associated therewith. Further, certain LC motor designs have been demonstrated to provide increased motor efficiency, torque, power factor, vibration, phase-leg-loss and other desirable motor properties over purely magnetic designs thus also improving economics and the environment.

Such improvements in power delivery and end use systems and the accompanying benefits can be realized by an enhanced discrete non-polarized capacitor having increased capacitance, heat dissipation and power transfer capabilities. Such improvements also could be realized by an enhanced discrete polarized capacitor having increased capacitance, increased voltage and ripple current ratings, reduced ESR, and improved heat dissipation and power transfer characteristics. The improved discrete capacitor characteristics and methods can also be beneficially applied to integrated circuits, digital chips and other electrical devices.

BRIEF SUMMARY OF THE INVENTION

As used herein, the term "a" or "an" may mean one or more. As used herein in the claim(s), when used in conjunction with the word "comprising", the words "a" or "an" may mean one or more than one. As used herein, "another" may mean at least a second or more.

The term "AC" and "AC source" are used in their broad sense. The term AC and AC source shall include but are not limited to fixed frequency, variable frequency, fixed amplitude, variable amplitude, frequency modulated, amplitude modulated, and/or pulse width modulated AC. Other signal and/or communication techniques including sideband and superposition as well as other linear, nonlinear, analog or digital signals and the like are expressly included. AC sources may include harmonic components. AC and AC source are considered to refer to time varying signals. These signals may contain data and/or power. Hybrid AC sources varying in multiple methods and/or modes are similarly included. References to a single AC source shall not be construed to eliminate plural AC sources.

As used herein the terms "adhese", "adhesion", "adhesed" and "adhere", shall include without limitation, methods, forces, mechanisms, techniques and materials whereby atom to atom, molecule to molecule and layer to layer bonding, gluing, sticking, adhering, attraction, affinity, sharing, and other methods, forces and materials used to secure, fasten, bond, connect, interconnect, weave, interweave, lock and key, or otherwise hold together like and/or dissimilar materials. This process shall include without limitation, nano, micro and macro connection and interconnection.

As used herein, the term "anodized" shall mean to subject a metal to electrolytic action at the anode of a cell in order to coat with a protective, insulated or decorative film.

As used herein, the term "capacitor" shall mean an electrical circuit element which is based on phenomena associated with electric fields. The source of the electric field is separation of charge, or voltage. If the voltage is varying with time, the electric field is varying with time. A time-varying electric field produces a displacement current in the space occupied by the field. The circuit parameter of capacitance relates the displacement current to the voltage. Energy can be stored in electric fields and thus in capacitors. The relationship between the instantaneous voltage and current of capacitors and the physical effects upon the capacitor are critical to capacitor improvements.

As used herein, the term "conductor" shall mean a material, such as a metal, which contains a large number of essentially free charge carriers. However, the term conductor is not limited to only a metal. These charge carriers are free to wander throughout the conducting material. They respond to almost infinitesimal electric fields, and they tend to continue to move as long as they experience a field. These free carriers carry the electric current when a steady electric field is maintained in the conductor by an external source of energy. Under static conditions, the electric field in a conductor vanishes. Conductors, include without limitation superconductors, high temperature superconductors, doped semiconductors, metalized films and the like are considered conductors when used for these purposes. A conductive layer is that layer or layers of the capacitor that forms a conductor. The conductive layer may be formed of a conductive polymer.

As used herein, the term "conformal" shall mean without limitation having the same operable shape with consistent dimensions.

As used herein, the term "conformal coating" shall mean without limitation the touching and/or bonding of one layer to another. The shapes of the two layers at their interface or boundary shall be matched as closely as practicable. If layer 'A' is concave in a region, then layer 'B' must be convex in this region to achieve this effect. The convex layer 'B' must be smaller than the concave layer 'A' in order to achieve this effect. In general, the tighter the fit of the conformal coating, the greater the bond strength and conformance of the conformal coating; and this provides a superiority of the boundary characteristics. Preferably, uniformity of conformal coating thickness is desirable.

As used herein, the terms "DC", "DC electricity" and "DC current" may be any technology, design, condition, physical condition or device, creating, causing, contributing, supporting, or favoring a unidirectional or predominantly unidirectional flux, displacement, transmission and/or flow of one or more electrical charge carriers including but not limited to electrons, ions and holes. This shall not be construed to exclude the bidirectional travel of oppositely charged particles. DC shall refer broadly to a steady state voltage that does not substantially vary with time.

As used herein, the terms "DC source", "DC voltage source" or "DC power source" is used in its broad sense. This term generally covers and includes any method and device used or useful in the generation, production or AC rectification to produce DC electricity. DC power supplies expressly include, but are not limited to DC generators, electrochemical batteries, photovoltaic devices, rectifiers, fuel cells, DC quantum devices, certain tube devices and the like. They shall include regulated, unregulated, filtered and non-filtered types. DC sources shall expressly include but are not limited to rectifiers powered by non-electrically isolated sources, autotransformers, isolation transformers, and ferroresonant transformers. DC-to-DC supplies, switching DC power supplies, pulse chargers and the like are similarly included. The singular term shall not be construed to exclude multiple and/or redundant DC sources in shunt, series and/or anti-series configurations. Single phase and polyphasic rectified DC sources and/or chargers are included. The ability to adjust the DC bias level in real time is similarly included. The use of 'diode dropper devices' and precisely regulated floating DC power supply voltages can provide operational and design benefits, especially where electrochemical batteries are included for power source redundancy, or are the anti-series PECs device employed.

As used herein, the term "dielectric" shall mean a substance in which all charged particles are bound rather strongly to constituent molecules. The charged particles may shift their positions slightly in response to an electric field, but they do not leave the vicinity of their molecules. Real dielectrics exhibit a feeble conductivity, but can generally be characterized as nonconductive. The electric field causes a force to be exerted on each charged particle, positive charges being pushed in the direction of the field, negative charges oppositely, so that positive and negative parts of each molecule are displaced from their equilibrium positions opposite directions. Dielectrics increase capacitance, increase maximum operating voltage and provide mechanical support between the conducting plates of a capacitor. There are various classes of dielectrics with exploitable characteristics. A dielectric layer is that layer or layers that form the dielectric of the capacitor.

As used herein, the term "dielectric constant" shall mean relative to that of a vacuum.

As used herein, the term "dielectric strength" shall mean the maximum strength which a dielectric can withstand without breakdown. If the electric field in a dielectric is made very intense, it will begin to excite large numbers of electrons to energies within the conductive band. This dislodges the excited electrons completely out of the molecules, and the material will become conductive in a process known as dielectric breakdown.

As used herein, the term "electrolyte" shall mean a material which exhibits electrical properties midway between conductors and dielectrics. Electrolytes are typically in the liquid phase in ambient weather conditions. Additives and impurities alter the electrical characteristics of electrolytes and electrolytic solutions.

As used herein, the term "enhanced surface" shall mean an increased surface area over all or a portion of a conductor layer or over all or a portion of a dielectric layer. The portion shall be considered enhanced when the surface area is enhanced over a gross area comprising greater than or equal to 2% of the nominal dimensions of the surface or region. For example, there will routinely be a border or boundary region surrounding the increased surface area which border region does not have enhanced surface area. For example, an enhanced surface area of a conductive or dielectric is surface area for a particular layer (conductive or dielectric) that has greater surface area than would a planar surface which has an area determined by multiplying its length by its width.

As used herein, the term "moiety" shall mean one of two approximately equal parts or basic and complementary divisions of the whole.

As used herein, the term "semiconductor" shall mean a material having electrical properties midway between conductors and dielectrics. Semiconductors are typically in the solid phase in ambient weather conditions. Additives, impurities and dopants alter the electrical characteristics of semiconductors.

As used herein, the term "polarized capacitor" shall include without limitation, other polarized electric charge storage (PECs) devices, such as electrochemical batteries, fuel cells, liquid tantalum capacitors, electrolytic capacitors, super capacitors, ultra capacitors, quantum devices and the like.

As used herein, the term "sharpy" shall mean a surface that can be characterized as having sharp points, angles, rapid changes of direction, dip, strike, and pitch, as well as abrupt demarcations and the like.

As used herein, the term "smooth" shall mean a surface that is relatively free of sharp points, angles, rapid changes of direction, dip, strike, and pitch, as well as minimally abrupt demarcations and the like.

As used herein, the term "topographical surface" shall mean a surface that is 3-dimensional in shape. The 3-dimensional surface may include any structure or projection extending from the surface.

As used herein, the term "undulation" or "undulating" shall mean a rising and falling in wavelike fashion. Undulating surfaces shall present a wavy appearance, surface, boundary or margin.

As used herein, the term "uniform" shall mean with respect to a distance that the distance between opposing surfaces of a conductive layer and a dielectric layer are of an equal distance. With respect to the thickness of the dielectric layer, it means that the layer has a relatively constant thickness.

The following discussion contains illustrations and examples of preferred embodiments for practicing the present invention. However, they are not limiting examples. Other examples and methods are possible in practicing the present invention.

The present invention relates to enhancing the current density, voltage rating, power transfer characteristics, and charge storage density of solid state and electrolytic capacitors by increasing the conductor surface area with smooth structures, reducing the distance separating the conductors, and improving the effective dielectric characteristics by employing construction techniques on the atomic and molecular levels.

The present invention relates generally to an electrical charge storage device (ECSD) with enhanced power characteristics. More particularly, the present invention relates to enhancing the current density, voltage rating, power transfer characteristics, and charge storage density of various devices, such as capacitors, batteries, fuel cells and other electrical charge storage devices. Electrical charge storage device electrical functions include conduction current and displacement current. They may also include mass transport, ion transport and charge generation by electrochemical means. Electrical charge storage device thermal functions include heat generation, heat conduction and heat radiation. For example, one aspect of the present invention is solid state and electrolytic capacitors where the conductor surface area is increased with smooth structures, thereby reducing the distance separating the conductors, and improving the effective dielectric characteristics by employing construction techniques on atomic, molecular, and macroscopic levels. The sizes, physical, quantum and electrical properties of the atoms and molecules forming the conductors and dielectrics, as well as—when employed the electrolyte chemical constituents—, will greatly vary. Similarly the application requirement temperature, pressure, mechanical forces and volume constraints will vary over wide ranges. The electrical applications will similarly vary over wide ranges in terms of voltage, current, frequency, capacitance required, transient demands, steady state demands, frequency responses, desirable stability and operational variation preferences and the like. Thus, many specific materials, material properties, structures, topologies, surface area enhancement methods, temperature control mechanisms, strengths, construction mechanisms, scales, sizes and packaging methods will be employed in a plethora of preferred implementations and embodiments of the present invention.

One aspect of the present invention is an electrical charge storage device exhibiting enhanced power characteristics.

Another aspect of the present invention is an increase in surface area within a spatial area or volume.

Another aspect of the present invention is an increase in surface area combined with a reduction in charge separation distance.

Yet another aspect of the present invention is an electrical charge storage device exhibiting increased structural strength.

Fundamental physical properties of solid state substances such as crystals depend upon the periodicity of the solid, over a specific dimensional scale, typically in the nm regime. These physical properties include dielectric constant, dielectric strength, conductivity, band gap, ionization potential, melting point and magnetic saturation. Precise control of the size and surface of solid state substances such as nanocrystals, polycrystals, crystals, interstitials, amorphous materials, metals and alloys can tune their properties. Techniques of atomic and molecular assembly can create new materials and products such as interstitial, nanocrystal and nanopoly-crystalline based materials.

In one implementation of the present invention, molecular makeup is varied to achieve conductive and nonconductive structures for construction of charge storage mechanisms by variation of the layers and numbers of layers of the underlying materials.

In one implementation the present invention has conductive and dielectric layers that mechanically support each other thereby providing increased strength. When an electric potential is impressed across the present invention the charge will not have sharp corners to accumulate at. During short circuits, motor power circuit reclosure, motor starting, motor locked rotor and transformer magnetizing inrush the mechanical strength of the device will help to prevent mechanical damage. The increased current to capacitance capabilities will allow higher currents without heat damage. Reduced voids, impurities, increased moiety, combined with atom by atom construction methods and quantum forces will additionally work to increase strength in the present invention.

Above a critical number of atoms, one particular bonding geometry; characteristic of an extended solid "locks in." As additional atoms are added, the number of surface atoms and the spatial volume change, but the basic nature of the chemical bonds in the cluster is not altered. Nanocrystal properties, slowly and smoothly extrapolate to large scale, according to scaling laws and heuristics.

In one embodiment, there is an electrical charge storage device which is macroscopically viewed as a flat plate capacitor, coaxial capacitor/conductor or other electrical waveguide which is so constructed as to enhance the surface area of the capacitor, conductor or waveguide.

In one embodiment, there is an electrical charge storage device which is macroscopically viewed as a flat plate capacitor, coaxial capacitor/conductor or other electrical waveguide which is so constructed as to enhance the electrical characteristics of the capacitor, conductor or waveguide.

In one embodiment, there is an electrical charge storage device which is macroscopically viewed as a flat plate capacitor, coaxial capacitor/conductor or other electrical waveguide which is so constructed as to enhance the thermodynamic characteristics of the capacitor, conductor or waveguide.

In one embodiment, there is an electrical charge storage device which is macroscopically viewed as a flat plate capacitor, coaxial capacitor/conductor or other electrical waveguide which is so constructed as to enhance the mechanical characteristics of the capacitor, conductor or waveguide.

In one embodiment, there is an electrical charge storage device that includes at least one smooth, undulating conducting, substrate surfaces. A second smooth layer, composed of dielectric is fabricated in intimate contact with the conducting layer, which dielectric layer conformally coats the substrate. At substantially every point, the undulating surface of the dielectric maintains moiety with the conductive substrate. A third smooth layer, of conductive, smooth undulating material is fabricated in intimate contact with the dielectric. Moiety is maintained throughout the surfaces such that the three layers undulate in a three dimensional matching fashion. One simple structure can be conceptually illustrated as resembling two sheets of corrugated iron separated by a sheet of corrugated plastic. Variation in dielectric thickness and strength will vary the rated capacitor voltage for a given dielectric relative permittivity. Variations in magnitude and period will alter the surface area enhancement over that of a flat sheet. Variation in relative permittivity of the dielectric will alter the required separation distance for a given voltage. The capacitance is determined by the relative permittivity, effective surface area and distance separation. The capacitive reactance is further determined by the electrical frequency, the structure and the frequency response of the materials. If on the other hand, the two pieces of corrugated iron are separated by a stiff piece of flat plastic and the relative peaks of the top and bottom layer of the corrugated iron are adjacent to each other, then there is expanded surface area, but there is not expanded useful surface area.

In one embodiment of the invention, there is an electrical charge storage device that has a first conductive layer having a first conductive surface; a dielectric layer having opposing first and second dielectric surfaces, the first dielectric surface having a substantially conformal surface with the first conductive surface; and a second conductive layer having a second conductive surface disposed adjacent to the second dielectric surface. The first and/or second conductive surfaces have a conductive substrate with a smooth, enhanced surface area which is constructed. Additionally, a conformal smooth layer of dielectric is deposited in intimate contact with the substrate. A conformal second conductive layer or substrate is then fabricated in intimate contact (moiety) with the open side of the conformal layer of dielectric to form a capacitor cell. The regionally symmetric dielectric layer will give rise to a displacement current when an electric potential is impressed across the said dielectric layer. The at least two conductive substrates may be terminated for electrical connection to other electrical circuit elements. Or, in the alternate, the process can continue, building an additional capacitor layer for connection in series or shunt.

In another embodiment of the invention, there is an electrical charge storage device that has at least one first conductive layer having a conductive curvilinear surface; at least one second conductive layer having a conductive curvilinear surface; and at least one dielectric layer disposed between the first conductive curvilinear surface and the second conductive curvilinear surface.

In another embodiment of the invention, there is an electrical charge storage device that has a first conductive layer having a first conductive curvilinear surface, a dielectric layer having opposing first and second dielectric curvilinear surfaces, the first dielectric curvilinear surface disposed proximate the first conductive curvilinear surface and substantially following the first conductive curvilinear surface across its area, and a second conductive layer having a second conductive curvilinear surface, the second conductive curvilinear surface disposed adjacent the second dielectric curvilinear surface and substantially following the second conductive curvilinear surface across its area.

In still yet another embodiment of the invention, there is an electrical charge storage device that has a first conductive layer having a first conductive smooth, enhanced surface; a dielectric layer having opposing first and second dielectric surfaces, the first dielectric smooth, enhanced surface disposed proximate the first conductive smooth, enhanced surface and substantially following the first conductive smooth, enhanced surface; and a second conductive layer having a second conductive smooth, enhanced surface, the second conductive smooth, enhanced surface disposed adjacent the second dielectric surface and substantially following the second conductive smooth enhanced surface.

In another embodiment of the invention, there is an electrical charge storage device that has a first conductive layer having a first conductive surface; a dielectric layer having opposing first and second dielectric surfaces, the first dielectric surface having a substantially conformal surface with the first conductive surface; and a second conductive layer having a second conductive surface disposed adjacent to the second dielectric surface.

In another embodiment of the electrical charge storage device, there is an electrical charge storage device that has a first conductive layer having a first conductive surface; a dielectric layer having opposing first and second dielectric surfaces, the first dielectric surface substantially maintaining moiety with the first conductive surface; and a second conductive layer having a second conductive surface disposed adjacent to the second dielectric surface.

In another embodiment of the electrical charge storage device, at least one first conductive layer, having a shaped topographical surface; at least one second conductive layer having a conductive shaped topographical surface; and at least one dielectric layer disposed between the first conductive shaped topographical surface and the second conductive curvilinear surface.

In one embodiment, the electrical charge storage device has a first conductive surface and a first dielectric surface that are substantially conformal.

In one embodiment, the electrical charge storage device has a second conductive surface and second dielectric surface that are substantially conformal.

In one embodiment, the electrical charge storage device has the first conductive surface substantially maintains moiety with the first dielectric surface.

In one embodiment, the electrical charge storage device has the second conductive surface substantially maintains moiety with the second dielectric surface.

In one embodiment, the electrical charge storage device has at least 2% of the first conductive surface area being conformal with an adjacent area of the first dielectric surface. With this particular percentage area being conformal, the electric storage device should exhibit enhanced power characteristics. Preferably, the two areas should be substantially conformal. In some instances, however, the surfaces may be constructed such that they are exactly conformal. For example, the two areas should be essentially-exact images of one another. However, the areas may be substantially conformal such that increased power characteristics of the device are achieved.

In one embodiment, the electrical charge storage device has at least 2% of the first conductive surface area maintaining moiety with an adjacent area of the first dielectric surface. Additionally, the second conductive surface area preferably should maintain moiety with an adjacent area of the second dielectric surface. With this particular percentage areas maintaining moiety, the electric storage device should exhibit enhanced power characteristics. Preferably, the two areas should maintain exact moiety. However, the areas may maintain substantial moiety such that increased power characteristics of the device are achieved. For example, there will routinely be a border or boundary region surrounding the interface area where the dielectric surface area, thickness, extent, breadth and/or depth will exceed that of the associated conductor layer. Similarly, at the point of electrical connection, or heat sinking area, the electrical conductor layer may routinely vary dimensionally from that of the dielectric layer.

In one embodiment, the electrical charge storage device has at least 2% of the first conductive surface area being disposed at a substantially uniform distance from the adjacent first dielectric surface area. For the given area, the distance of each atom or molecule for the conductive surface is at a substantially uniform distance with the opposing atom or molecule of the dielectric surface.

In one embodiment, the electrical charge storage device has at least 2% of the first conductive surface area being disposed at a selected distance ranging from 0.0001 µm to 2000 µm from the first dielectric surface area. Additionally, in another embodiment, it is preferred that the second conductive surface area be disposed at a selected distance ranging from 0.0001 µm to 2000 µm from the second dielectric surface area. The selected distance of the various embodiments from 0.0001 µm to 2000 µm are selectable for the particular electrical charge storage device. The selected distance may vary a particular selectable tolerance for a given selected distance. For example, the selected distance may vary a particular percentage for the distance.

In one embodiment, the electrical charge storage device may have smooth, enhanced surface area for the conductive and/or dielectric layers of the inventive device. Preferably, the surface of an adjoining conductive layer and dielectric layer, have a similar smooth surface area structure. In various embodiments of the inventive device, the smooth enhance surface area structures may be: i) alveolar in shape (like a biological lung), ii) sinusoidal rows in shape, iii) embedded in a permeable vertical fashion (like a sponge), iv) parabolic in shape, v) inverted or everted (i.e. it could be convex or concave), vi) spiral in shape, vii) random swirl in shape, vii) quasi random swirl in shape, viii) can be mathematically defined (such as, sin(X)sin(Y), (A)sin(bX)sin(bY), parabolic, conical, etc.), ix) tubular in shape, x) annular in shape, xi) toroidal in shape.

In one embodiment of the electrical charge storage device, the device reduces dielectric heating by the use of smooth structures.

In another embodiment of the electrical charge storage device, a conformal filter medium is constructed between one substrate and the adjacent conformal layer of dielectric. The conformal filter medium wets the adjacent substrate and dielectric with an electrolytic fluid of known compositions. The conformal filter medium will allow ion transport to cause a displacement current to occur across the conformal dielectric layer. A second conformal conductive substrate is then fabricated in intimate contact with the structure to complete the electrolytic capacitor cell. The at least two conductive substrates may be terminated for electrical connected to other electrical circuit elements. Or in the alternate, the process can continue, building an additional capacitor layer.

In one embodiment of the electrical charge storage device, materials used for the conductive layers and the dielectric layers are adhesed to one another in the construction or fabrication process.

In one embodiment of the electrical charge storage device, variation in adhesion parameters are employed to alter device structure.

In one embodiment of the electrical charge storage device, at least one conductive layer is comprised of an alloy and/or a metal, including, but not limited to aluminum, iron, copper, silver, gold or a combination thereof.

In another embodiment of the electrical charge storage device, the device is constructed with a substrate, including, but not limited to the following: iron substrate, aluminum substrate, ceramic substrate, silicon substrate, and carbon substrate, or a combination thereof.

In one embodiment of the electrical charge storage device, the dielectric layer is constructed with any of the following: a crystalline substance, a polycrystalline substance, or an amorphous substance.

In one embodiment of the present invention the device is constructed with an aluminum oxide dielectric layer in a crystalline form (for example sapphire), polycrystalline form, layered form, amorphous form (similar to glass) or in hybrid form.

In one embodiment of the present invention the molecular orientation and structure of the conductive surface material is selected to allow maximum electrical conduction.

In one embodiment of the present invention the molecular orientation and structure of the dielectric surface material is selected to provide minimum electrical conduction In various embodiments of the electrical charge storage device, the device is constructed with a dielectric layer comprised of any of the following: silicon dioxide dielectric, a ceramic dielectric, a titania ceramic dielectric, a titanic ceramic dielectric, barium titanate dielectric, strontium titanate dielectric, lead zirconium titanate dielectric, diamond dielectric, or a diamond matrix dielectric, an organic dielectric, a polymer dielectric, or an organic substance.

In one embodiment of the electrical charge storage device, the device is formed as a capacitor.

In one embodiment of the electrical charge storage device, the device is formed as a battery.

In one embodiment of the electrical charge storage device, the device is formed as a fuel cell.

In one embodiment of the electrical charge storage device, the device is formed as a discrete capacitor.

In one embodiment of the electrical charge storage device, the device is formed as a chemical double-layer capacitor.

In one embodiment of the electrical charge storage device, at least one conductive layer is composed of a semiconductor.

In one embodiment of the electrical charge storage device, a multilayer dielectric is deposited in order to increase dielectric constant and dielectric strength simultaneously.

In one embodiment of the electrical charge storage device, a compound dielectric is deposited in order to increase dielectric constant and dielectric strength simultaneously.

In one embodiment, the inventive device contains or further comprises a filter structure.

In one embodiment, the electrical charge storage device contains or further comprises an ion transport structure.

In one embodiment, the electrical charge storage device contains or further comprises an electrolyte.

In one embodiment, the electrical charge storage device supports ion transport.

In one embodiment, the electrical charge storage device supports charge separation.

In one embodiment, the electrical charge storage device supports electrical conduction.

In one embodiment, the electrical charge storage device supports displacement current.

In one embodiment, a voltage is impressed across the electrical charge storage device.

In one embodiment, an electric field is formed in the electrical charge storage device.

In one embodiment, the volume density of the electrical charge storage device is increased over that of a flat plate, conventional capacitor.

In one embodiment, the rated voltage of the electrical charge storage device is increased over that of a conventional electrolytic capacitor.

In one embodiment, the electrical charge storage device contains or further comprises a solid at (Twenty Five Degrees Centigrade) 25.0 [° C.] or a liquid at 25.0 [° C.].

In one embodiment, the electrical charge storage device contains or further comprises a super cooled liquid at (Twenty Five Degrees Centigrade) 25.0 [° C.].

In one embodiment, the electrical charge storage device contains or further comprises a gas at (Twenty Five Degrees Centigrade) 25.0 [° C.].

In one embodiment, the dielectric layer of the electrical charge storage device charging process is aided by an electrolyte such as alcohol, water or a polymer.

In one embodiment, dielectric layer charging is aided by an electrolyte contains or further comprises any one of the following: a base, a solvent, a salt, an acid, an oxidizing agent or reducing agent.

In one embodiment, the dielectric layer is composed with mica.

In one embodiment of the electrical charge storage device, the device reduces dielectric heat rise by intimate contact with at least one conductive layer.

In one embodiment of the electrical charge storage device, the device reduces dielectric heat rise by intimate contact with at least one heat sink.

In one embodiment of the electrical charge storage device, the device reduces dielectric heat rise by operational connection with at least one heat exchanger.

In one embodiment of the electrical charge storage device, the device reduces dielectric heat rise by operational connection with at least one cooling mechanism.

In one embodiment of the electrical charge storage device, the device reduces dielectric heat rise by operational connection with at least one cryogenic cooling mechanism.

In one embodiment of the electrical charge storage device, the device electrical properties are altered by operational connection with at least one cooling mechanism.

In one embodiment of the electrical charge storage device, the device electrical properties are altered by operational connection with at least one cooling or cryogenic cooling mechanism.

In one embodiment of the electrical charge storage device, the device dielectric electrical properties are altered by operational connection with at least one cooling or cryogenic cooling mechanism.

In one embodiment of the electrical charge storage device, the first and/or second conductive layers electrical properties are altered by operational connection with at least one cooling or cryogenic cooling mechanism.

In one embodiment of the electrical charge storage device, the device electrical properties are altered by one temperature changing mechanism.

In one embodiment of the electrical charge storage device, the device reduces electrolyte heat rise by intimate contact with at least one heat sink.

In one embodiment of the electrical charge storage device, the device reduces electrolyte heat rise by operational connection with at least one heat exchanger.

In one embodiment of the electrical charge storage device, the device reduces dielectric heat rise by operational connection with at least one cooling mechanism.

In one embodiment of the electrical charge storage device, the device reduces electrolyte heating by reducing ion transport distance.

In one embodiment of the electrical charge storage device, the device reduces electrolyte heating by improving ion transport paths.

In one embodiment of the electrical charge storage device, the electrical conductivity of at least one conductive layer is altered by doping.

In one embodiment of the electrical charge storage device, the electrical characteristics of the dielectric layer are altered by doping.

In one embodiment of the electrical charge storage device, at least one atom is adhesed to at least one atom or molecule.

In one embodiment of the electrical charge storage device, at least one molecule is adhesed to at least one atom or molecule.

In one embodiment of the electrical charge storage device, at least one conductive atom or molecule is adhesed to at least one dielectric atom or molecule.

In one embodiment of the electrical charge storage device, at least one atom is adhesed to the at least one substrate.

In one embodiment of the electrical charge storage device, the substrate is bonded to the dielectric layer.

In one embodiment of the electrical charge storage device, at least one adhesive bonds at least one conductive layer to at least one dielectric layer.

In one embodiment of the electrical charge storage device, the device further comprises at least one conductive channel to carry electrical current to an interface of the first conductive layer and the first dielectric layer interface.

In one embodiment of the electrical charge storage device, the device further comprises at least one conductive channel to carry electrical current to an interface of the second conductive and second dielectric layer.

In one embodiment of the electrical charge storage device, the device further comprises at least one conductive channel to transport at least one ion to a conductive layer/electrolyte interface.

In one embodiment of the electrical charge storage device, the device has at least one conductive layer insulated on its edge to reduce fringing effects.

In one embodiment of the electrical charge storage device, at least one conductive layer is insulated on its edge to prevent arcing.

In one embodiment of the electrical charge storage device, at least one conductive layer is bonded to at least one wire.

In one embodiment of the electrical charge storage device, at least one conductive layer is insulated to prevent capacitor shorting.

In one embodiment of the electrical charge storage device, at least one pressure relieving vent is included.

In one embodiment of the electrical charge storage device, a seal (gasket material or rubber, etc.) is included.

In one embodiment of the electrical charge storage device, at least one tab is connected to at least one conductive layer. A tab is a thin metal strip connecting a positive terminal of a polarized electrical charge storage device such as an electrolytic capacitor to an anode foil. Other tabs may connect a cathode foil to the negative terminal.

Combination of Inventive Device with Other Devices

The inventive electrical charge storage device may be utilized with various devices and other electronics. The embodiments described herein, are not meant to limit the use of the electrical charge storage device, but identify some of the germane uses of the inventive capacitor.

In one embodiment of the electrical charge storage device, at least one conductive layer is operably connected to at least one wire.

In one embodiment of the electrical charge storage device, at least one electrical charge storage device is operably connected to at least one additional capacitor and/or at least one other electrical charge storage device.

In one embodiment, the device is configured as a discrete capacitor and is operably connected to at least one additional inventive device which is configured as a discrete capacitor.

In one embodiment of the electrical charge storage device, at least one conductive layer is operably connected to a DC source.

In one embodiment of the electrical charge storage device, at least one conductive layer is operably connected to an AC source.

In one embodiment of the electrical charge storage device, at least one conductive layer is operably connected to an DC source and an AC source.

In one embodiment of the electrical charge storage device, at least one conductive layer is operably connected to an DC bias source and an AC source.

In one embodiment of the electrical charge storage device, at least one pair of polarized capacitors are connected in an anti-series configuration.

In one embodiment of the electrical charge storage device, at least one conductive layer of the device is operably connected to at least one heat sink.

In one embodiment of the electrical charge storage device, the device is operably connected to at least one electrical component.

In one embodiment of the electrical charge storage device, the device is operably connected to at least one resistor.

In one embodiment of the electrical charge storage device, the device is operably connected to at least one semiconductor.

In one embodiment of the electrical charge storage device, the device is operably connected to at least one diode.

In one embodiment of the electrical charge storage device, the device is operably connected to at least one rectifier.

In one embodiment of the electrical charge storage device, the device is operably connected to at least one controlled rectifier.

In one embodiment of the electrical charge storage device, the device is operably connected to at least one inductor.

In one embodiment of the electrical charge storage device, the device operating temperature is set and maintained by external methods.

In one embodiment of the electrical charge storage device, the device operating pressure is set and maintained by external methods.

In one embodiment of the electrical charge storage device, the device operating orientation is set and maintained by external methods.

Construction Methods and Techniques for Inventive Device

The electrical charge storage device may be constructed in various sizes, for example, as a nanoscale, microscale, molecular scale, or as a macroscale device. The inventive device may be constructed in such a way that the various components of the inventive device are constructed or fabricated, atom by atom, molecule by molecule, or a combination thereof. The conductive and dielectric layers may be fabricated layer by layer, or atom by atom. Preferably nanotechnology processes and techniques are utilized to create the electrical charge storage device. However, macroscopic techniques can be employed to achieve the enhanced energy storage and power characteristics, enhanced surface area moiety and the like. The nanotechniques and macroscopic techniques should be considered illustrative and not limiting. The order or sequence of the construction of the conductive and dielectric layers may be accomplished in any order, including contemporaneous construction of the layers.

The conductive and dielectric layers of the inventive device may be fabricated layer by layer, or atom by atom in a macroscopic manner to duplicate the results of the expanded surface area, reduced charge separation distance and increased power characteristics.

In one method of constructing the inventive device, the conductive and dielectric layers are fabricated molecule by molecule. In another method of constructing the inventive device, the conductive and dielectric layers are fabricated atom by atom.

In one method for manufacturing the electrical charge storage device, the process includes the steps of constructing at least one first conductive layer having a conductive curvilinear surface; constructing at least one second conductive layer having a conductive curvilinear surface; and constructing at least one dielectric layer disposed between the first conductive curvilinear surface and the second conductive curvilinear surface.

In another method for manufacturing the electrical charge storage device, the process includes the steps of constructing a first conductive layer having a first conductive curvilinear surface; constructing a dielectric layer having opposing first and second dielectric curvilinear surfaces, the first dielectric curvilinear surface disposed proximate the first conductive curvilinear surface and substantially following the first conductive curvilinear surface across its area; and constructing a second conductive layer having a second conductive curvilinear surface, the second conductive curvilinear surface disposed adjacent the second dielectric curvilinear surface and substantially following the second conductive curvilinear surface across its area.

In another method for manufacturing the electrical charge storage device, the process includes the steps of constructing a first conductive layer having a first conductive smooth, enhanced surface; constructing a dielectric layer having opposing first and second dielectric surfaces, the first dielectric smooth, enhanced surface disposed proximate the first conductive smooth, enhanced surface and substantially following the first conductive smooth, enhanced surface; and constructing a second conductive layer having a second conductive smooth, enhanced surface, the second conductive smooth, enhanced surface disposed adjacent the second dielectric surface and substantially following the second conductive smooth, enhanced surface.

In another method for manufacturing the electrical charge storage device, the process includes the steps of constructing a first conductive layer having a first conductive surface; constructing a dielectric layer having opposing first and second dielectric surfaces, the first dielectric surface having a substantially conformal surface with the first conductive surface; and constructing a second conductive layer having a second conductive surface disposed adjacent to the second dielectric surface.

In another method for manufacturing the electrical charge storage device, the process includes the steps of constructing a first conductive layer having a first conductive surface; constructing a dielectric layer having opposing first and second dielectric surfaces, the first dielectric surface substantially maintaining moiety with the first conductive surface; and constructing a second conductive layer having a second conductive surface disposed adjacent to the second dielectric surface.

In another method for manufacturing the electrical charge storage device, the process includes the steps of constructing a first conductive layer having a first conductive surface; constructing a dielectric layer having opposing first and second dielectric surfaces, the first dielectric surface having a substantially conformal surface with the first conductive surface; and constructing a second conductive layer having a second conductive surface disposed adjacent to the second dielectric surface.

In another method for manufacturing the electrical charge storage device, the process includes the steps of constructing a first conductive layer having a first surface; constructing a dielectric layer having opposing first and second dielectric surfaces, the first dielectric disposed proximate the first surface and substantially following the first surface; constructing a second conductive layer having a surface, the second conductive surface disposed adjacent the second dielectric surface and substantially following the second surface; and wherein at least a portion of the first and/or second dielectric surfaces have sharpy structures.

In one method of constructing or fabricating the electrical charge storage device, a dielectric film is deposited.

In one method of constructing or fabricating the electrical charge storage device, a porous media is deposited. Within the fluid filled portion of an electrolytic type electrical charge storage device. The porous media allows ion transport, like a paper layer, and can be viewed similar to a sponge. It wets the layers and allows current flow. Electrochemicals can be employed in these porous media (like in a car battery, tantalum cap, electrolytic cap, super capacitor, ultra capacitor, fuel cell and the like, i.e., all the PECS devices).

In one method of constructing or fabricating the electrical charge storage device, a permeable media is deposited. Within the fluid filled portion of an electrolytic type electrical charge storage device. The permeable media allows ion transport, like a paper layer, and can be viewed similar to a sponge. It wets the layers and allows current flow. Electrochemicals can be employed in these permeable media (like in a car battery, tantalum cap, electrolytic cap, super capacitor, ultra capacitor, fuel cell and the like, i.e., all the PECS devices).

In one method of constructing the electrical charge storage device, chemical parameters are controllably varied in time and space in order to alter device physical structures.

In one method of constructing the electrical charge storage device, a chemical vapor deposition (CVD) process is employed.

In one method of constructing the electrical charge storage device, a plasma enhanced chemical vapor deposition (PECVD) process is employed.

In one method of constructing the electrical charge storage device, a cure/anneal process is conducted.

In one method of constructing the electrical charge storage device, a source of reactive oxygen is employed.

In one method of constructing the electrical charge storage device, nanomanipulation techniques, equipment and processes are used to construct any one of leads, conductors, electrolytes, wetting mechanisms or dielectrics.

In one method of constructing the electrical charge storage device, microscale assembly techniques, equipment and processes are used to construct any one of the leads, conductors, electrolytes, wetting mechanisms or dielectrics.

In one method of constructing the electrical charge storage device, lithography tools, equipment and processes are used to construct any one of the leads, conductors, electrolytes, wetting mechanisms or dielectrics.

In one method of constructing the electrical charge storage device, etching tools, equipment and processes are used to construct any one of the leads, conductors, electrolytes, wetting mechanisms or dielectrics.

In embodiments of constructing the electrical charge storage device, one or more of the following may be employed: microelectromechanical devices, at least one microsensor, at least one nanosensor, at least one arrayed probe, at least one arrayed nanotube, at least one electromagnetic field, at least one manipulable electromagnetic field, and/or at least one nanoelectromechanical device.

In one method of constructing the electrical charge storage device, surface coating is employed.

In one method of constructing the electrical charge storage device, adhesion is employed.

In one method of constructing the electrical charge storage device, controllable variation of adhesive parameters is employed to alter device physical structures.

In one method of constructing the electrical charge storage device, etching tools, equipment and processes are used to construct leads, conductors and dielectrics.

The following equipment and processes may be employed in the construction of the inventive device: i) large scale equipment and processes, ii) small scale equipment and processes, iii) micro scale equipment and processes, or iv) nano scale equipment and processes.

In one embodiment of the electrical charge storage device, the device further includes a wetting mechanism. In another embodiment, at least one microfluidic channel network is included in the wetting mechanism.

In one embodiment of the electrical charge storage device, the device further includes a wetting mechanism composed of at least one nanotube.

In one method of constructing the electrical charge storage device, a photosensitive substrate is employed.

In one method of constructing the electrical charge storage device, a photosensitive layer is deposited.

In one method of constructing the electrical charge storage device, a photosensitive region is deposited.

In one method of constructing the electrical charge storage device, a mask pattern is employed.

In one method of constructing the electrical charge storage device, an electrode is operably connected to the first and/or second conductive layer.

In one method of constructing the electrical charge storage device, an electrode is operably connected to a conductive substrate.

In one method of constructing the electrical charge storage device, an electrode is operably connected to a semiconductor.

In one method of constructing the electrical charge storage device, an electrode is operably connected to a dielectric.

In one method of constructing the electrical charge storage device, a probe is employed.

In one method of constructing the electrical charge storage device, a reagent is employed.

In one method of constructing the electrical charge storage device, a wafer is constructed.

In one method of constructing the electrical charge storage device, microfluidic analysis is conducted.

In one manner of constructing the electrical charge storage device, materials are delivered to the device by a nanotube.

In one manner of constructing the electrical charge storage device, materials are delivered to the device by a single layer nanotube.

In one manner of constructing the electrical charge storage device, materials are delivered to the device by a multi-layer nanotube.

In one manner of constructing the electrical charge storage device, a laser is employed.

In one manner of constructing the electrical charge storage device, materials are fused to the device by a laser.

In one manner of constructing the electrical charge storage device, any one or more of the following may be used: a microscope, a heat source, or a heat sink.

In one manner of constructing the electrical charge storage device, the materials are monitored via a nanotube.

In one manner of constructing the electrical charge storage device, the materials are manipulated by a nanotube.

In one manner of constructing the electrical charge storage device, the material temperatures are measured.

In one manner of constructing the electrical charge storage device, the material chemical properties are measured.

In one manner of constructing the electrical charge storage device, the material electrical properties are measured.

In one manner of constructing the electrical charge storage device, the material physical properties are measured.

In one manner of constructing the electrical charge storage device, the material quantum properties are measured.

In one manner of constructing the electrical charge storage device, a corrosive process is employed.

In one manner of constructing the electrical charge storage device, an etching process is employed.

In one manner of constructing the electrical charge storage device, the conductive layers and dielectric layers are incorporated within a printed circuit board.

In one manner of constructing the electrical charge storage device, the conductive layers and dielectric layers are incorporated within an integrated circuit.

In one manner of constructing the electrical charge storage device, the conductive layers and dielectric layers are i) enclosed in a package, or ii) encapsulated.

In one manner of constructing the electrical charge storage device, the conductive layers and an electrolyte are enclosed in a package.

In one manner of constructing the electrical charge storage device, the device is enclosed in a metal package, in a plastic package, in a silicon based package, in a carbon-based package, or in a ceramic package.

In at least one construction method for the electrical charge storage device, the process includes growing microscopic structures such as: crystals, mats, filter mats, beds, webs and particle clouds.

The inventive device may be built in any suitable form, such as flat, cylindrical, spherical or other than flat form.

The inventive device may be constructed in one form such as flat and subsequently rolled or processed into any other suitable form, such as flat, cylindrical, spherical or other than flat form.

Packaging of the Inventive Device

Once the inventive devices are constructed or fabricated, the device may be rolled, especially if in flat form, for final packaging purposes. The one or more inventive devices may stored or housed in packaging containers. The packaging containers may be cylindrical, annular section, rectangular parallelepiped, as well as other container shapes. The containers may be water proof, pressure rated, or vibration mounted (shock mounted).

Electrical Charge Storage Device with Smooth Cap with Villiform Small Structures In one implementation of the instant invention a smooth overall structure with villiform microstructure is constructed. The overall mechanical strength of the smooth overall structure is maintained. In the realm of the small, sharp bristles are introduced. These bristles constructed for strength and surface area increase serve to distribute and accumulate great charge concentrations. Consider a large smooth mountain. Each gentle slope curves ever so slightly. There are ups and downs, valleys, crest, plateaus and summit. Each spot on this mountain can be easily traveled; north, east, west or south. One can ascend, descend or traverse with almost equal effort. But wait, let us investigate closer. The green carpet of grass catches our eye. Upon closer observation the apparently smooth mountain structure is interrupted at the smallest level. The stems and leaves of grass interrupt the continuity and smoothness of our alpine meadow. The grass seeks maximum solar exposure for energy uptake. The little sprigs of grass have not reduced the strength of the mountain, yet the sprigs have massively increased the mountainous surface area.

In one implementation of the instant invention a smooth overall structure with villiform nanostructure is constructed. Scarlet O'Hare in Gone with the Wind visits Rhett Butler in a velvet dress, recycled from drapery. As above at the tiniest level, noticed only by the love stricken pair the smooth lines of the starlet's figure are abruptly disrupted by the pile of velvet. The extreme villocity of the velvet does not reduce the allure of Miss Leigh to Mr. Gable. In fact the soft velvet pile exudes a power all its own. The tiny but visible bristles create a depth unmatched by most other fabrics. In a similar manner, the villous nanostructure provide a strong mechanical structure for charge accumulation, fault conditions and voltage strength for the capacitors of the present invention.

In one implementation of the electrical charge storage device, the conductive and dielectric layers are constructed with a smooth overall structure with villiform microstructure having villiform nanostructure. High mechanical strength and effective dielectric strength are maintained. A high surface area and thus high charge concentration and accumulation is achieved by employing a sharpy topology. The various forces, torques, stresses and thermal activity, characterized by high voltage and high current conditions are thus encountered without significant capacitor degradation.

Electrical Charge Storage Device with Sharpy Structures

Another aspect of the electrical charge storage device is an electrical storage device having sharpy structures. In one embodiment, there is an electrical charge storage device having sharpy structures on at least a portion of the conductive and/or dielectric layers of the device.

In one embodiment, there is an electrical charge storage device that has a first conductive layer having a first surface; a dielectric layer having opposing first and second dielectric surfaces, the first dielectric disposed proximate the first surface and substantially following the first surface; a second conductive layer having a surface, the second conductive surface disposed adjacent the second dielectric surface and substantially following the second surface; wherein at least a portion of the first and/or second dielectric surfaces have sharpy structures.

In one embodiment of the electrical charge storage device, the storage device includes a first conductive layer having a first surface and a dielectric layer having opposing first and second dielectric surfaces. The conductive layer first surface is disposed proximate to the first surface of the dielectric layer and substantially follows the dielectric surface. The device also includes a second conductive layer having a surface, the second conductive surface disposed adjacent to the second dielectric surface and substantially following the second dielectric surface.

One aspect of the device is at least a portion of the first and/or second conductive surfaces have sharpy structures. Additionally, at least a portion of the first or second dielectric surfaces may also have sharpy structures. Without limitation, some of these structures include dendrite structures, such as a substantially tree and leaf structure, a substantially nerve-like structure, a substantially a synapse-like structure, or a substantially a blood vessel and capillary-like structure.

In one implementation of the electrical charge storage device, the conductive and dielectric layers are constructed with a smooth overall structure with dendrite, Fresnel, tree and leaf and other high angular construction. Interwoven, insulated random tangles of conductors (like a sack full of snakes or a colander full of spaghetti). These various structures provide for increased power characteristics.

In one implementation of the electrical charge storage device, the surface area of the capacitor is expanded by the use of sharpy structures.

In one implementation of the electrical charge storage device, electrical charge storage density is increased by the use of sharpy structures.

In one implementation of the electrical charge storage device, the total charge density of the capacitor is increased by the use of sharpy structures.

In one implementation of the electrical charge storage device, the instantaneous current capability of the capacitor is increased by the use of sharpy structures.

In one implementation of the electrical charge storage device, the charge accumulation rate of the capacitor is enhanced by the use of sharpy structures.

In one implementation of the electrical charge storage device, repulsive forces are countered by the use of adhesion.

In one implementation of the electrical charge storage device, entropy is countered by the use of adhesion.

In one implementation of the inventive capacitor materials are maintained in place by the use of adhesion.

In one implementation of the inventive capacitor materials are brought together by the use of adhesion.

In one aspect of the invention the moiety between the dielectric layers and the conductive layer promote cooling of the inventive capacitor.

It should be noted that although a summary of most of the embodiments of the present invention are described above, other embodiments are set forth in the claims. Those embodiments included by reference in the summary of the invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Capacitors are generally described mathematically by those knowledgeable in the field. There are several systems of units and conversions which are commonly employed. It is not uncommon to jump back and forth among systems. The basic physical and mathematical definitions and relationships are as follows, using the passive sign circuit convention, where applicable:

$Q = 8.9874 \times 10^9 \, Nm^2 C_{ou}^2$ (Unit of Charge, the Coulomb)
$E0 = 8.854 \times 10^{12} \, C_{ou}^2/NM^2$ (Permittivity of Free Space)
$C = Q/V$
$v = (1/C) \Sigma i dt + v t_0$ (Summation or Integral from $t_0$ until $t_f$)
$i = C \, dv/dt$
$p = vi = Cv \, dv/dt$
$w = Cv^2/2$
$C = E_0 E_R (A/d)$ (Parallel Plate Capacitor Geometry)

Capacitors are characterized by certain qualitative circuit actions and reactions. This circuit behavior is summarized by the following heuristics: i) capacitors will permit an instantaneous change in terminal current, ii) capacitors will oppose an instantaneous change in terminal voltage, and iii) charged capacitors appear as an open circuit to constant (DC) voltages.

Figure 1:
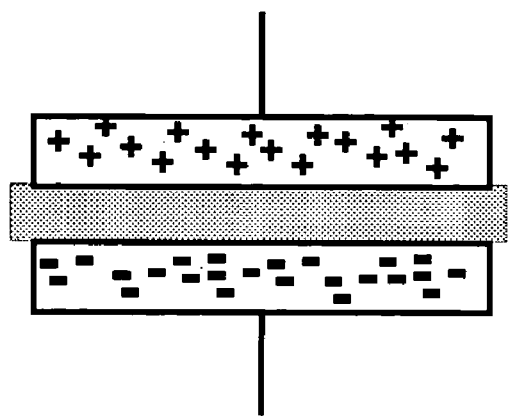
FIG. 1 shows an instantaneous charge accumulation on the conductor plates of a generalized capacitor having a planar surface for the conductive layers.
Figure 2:
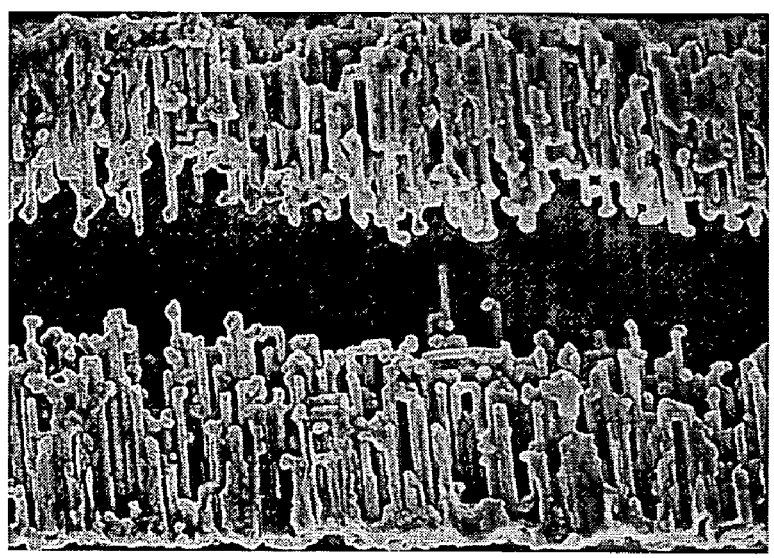
FIG. 2 represents a magnified cross-sectional view of an exemplary embodiment of a prior art polarized electrolytic capacitor having conductor foils.
Figure 3:
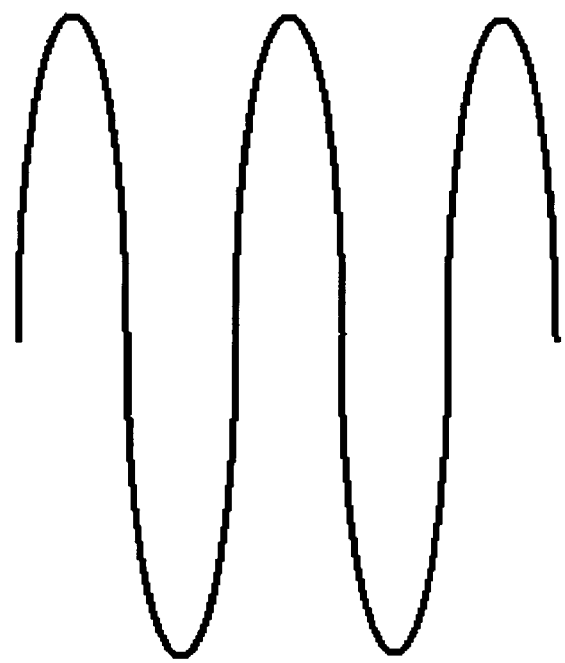
FIG. 3 illustrates a smooth two dimensional figure.

FIG. 3 illustrates a smooth two dimensional figure. The surface of the one or more conductive layers may be formed with a smooth surface. Additionally, the dielectric layer may be formed in with a similar smooth surface. One mathematical model for a two dimensional, smooth figure is the sine wave. The smooth valleys 31 and peaks 33 can be physically extended into several smooth, three dimensional surfaces as further described below and show in FIG. 4. For example, the drawing can be considered a side view of a smooth, three dimensional, channel or hill and valley structure.

Figure 4:
FIG. 4 illustrates a smooth three dimensional structure.

FIG. 4 illustrates a smooth three dimensional structure that may be utilized for the present invention. This structure can be considered a valley 31 and peaks 33 structure or a sine wave or similar undulation linearly extended in a planar surface. So long as the gradient variation is gradual the structure can be considered smooth. Gradual changes in slope of the surface may be made.

Figure 5:
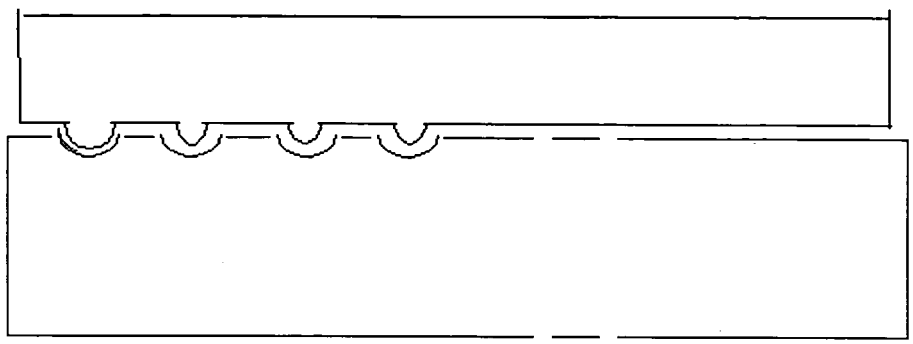
FIG. 5 illustrates moiety showing that the top and bottom structures are conformal.

FIG. 5 illustrates the concept of moiety between layers. The top and bottom structures are conformal. FIG. 5 is shown emphasized with a distance separation between the top 41 and bottom 43 halves. As illustrated in the figure, the surfaces maintaining moiety with between the first surface 45 and the second surface 47. In certain embodiments of the present invention, the conductive layer maintains moiety with dielectric layer.

Figure 6:
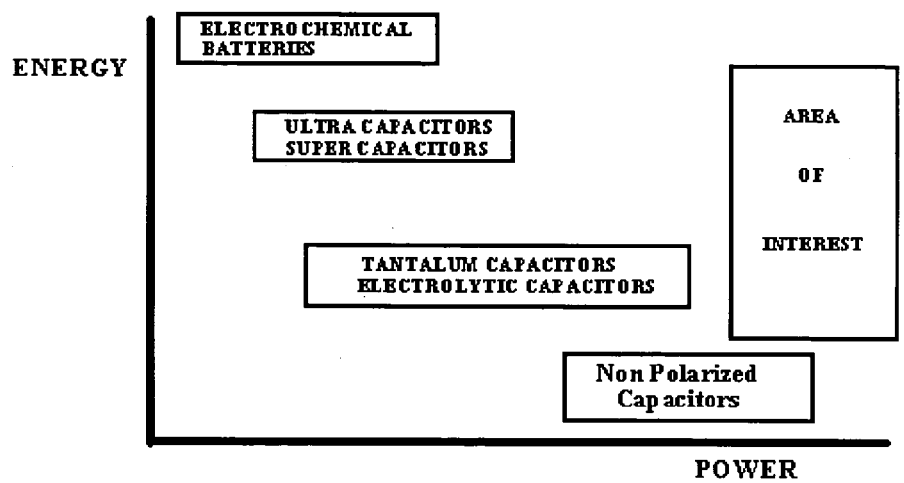
FIG. 6 illustrates the relative relationship between the electrical energy storage characteristics and the power transfer aspects of the technology.

FIG. 6 illustrates one of the many objects of the electrical charge storage device, one object to enhance power characteristics of electrical charge storage devices. FIG. 6 is meant to be illustrative and not limiting. FIG. 6 shows the relative relationship between the electrical energy storage characteristics and the power transfer aspects of the inventive electrical charge storage device. The figure illustrates Energy 61 on the y-axis and Power 62 on the x-axis. The box entitled "area of interest" shows generally where one implementation of the inventive technology lies in comparison to other presently available technology. The "area of interest" box 67 is believed to show the region of the energy to power graph where the inventive electrical charge storage device resides in comparison to other existing technology. As shown significant variation exists among each technology. For example lead calcium batteries 63 may be of the deep cycle type, having high energy storage design. An identical Amp Hour starting battery on the other hand will not store the total quantity of energy, but can provide significantly greater instantaneous power. Similarly there are various symmetrical and asymmetrical super and ultra capacitor designs 64 which have widely divergent energy density and power density profiles. Further, tantalum capacitors 65 have various power and energy characteristics. A non-polarized capacitor 66 may have good power characteristics, but low energy storage. The electrical charge storage device exhibits increases in power and energy over the existing technology.

Figure 7:
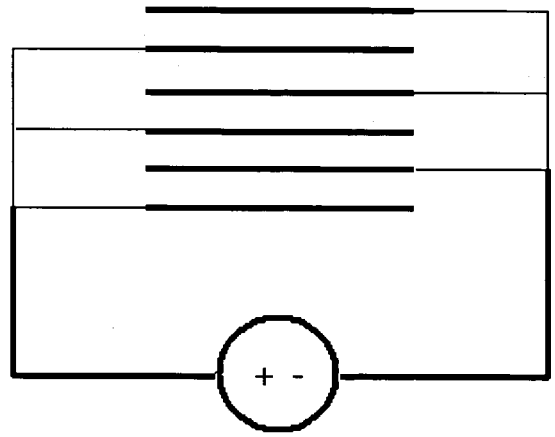
FIG. 7 illustrates a construction method whereby the count of conductive layers is reduced in a parallel capacitor assembly.

FIG. 7 illustrates a construction method whereby the count of conductive layers is reduced in a parallel capacitor assembly. Reducing conductor count is an object of this invention.

Figure 8:
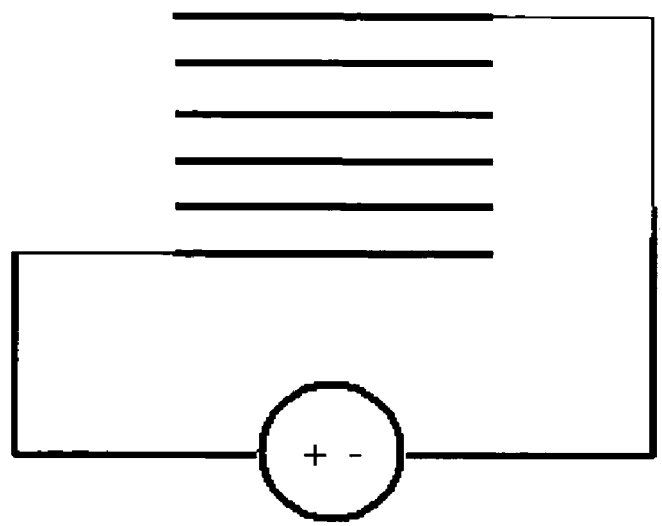
FIG. 8 illustrates a construction method whereby the count of conductive layers and interconnections is reduced in a series capacitor assembly.

FIG. 8 illustrates a construction method whereby the count of conductive layers and interconnections is reduced in a series capacitor assembly.

Figure 9A:
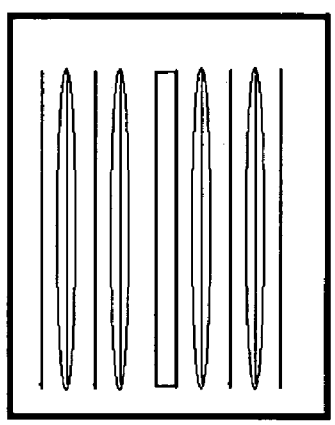
FIG. 9A-9B illustrates a construction method whereby the count of conductive layers and interconnections is reduced in an anti-series capacitor assembly.
Figure 9B:
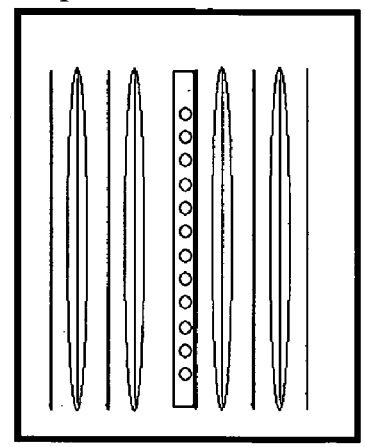

FIGS. 9A and 9B illustrate a construction method whereby the count of conductive layers and interconnections is reduced in an anti-series capacitor assembly. This technique can be employed in the use of forwardly biased, polarized capacitors in continuous AC applications.

Figure 10:
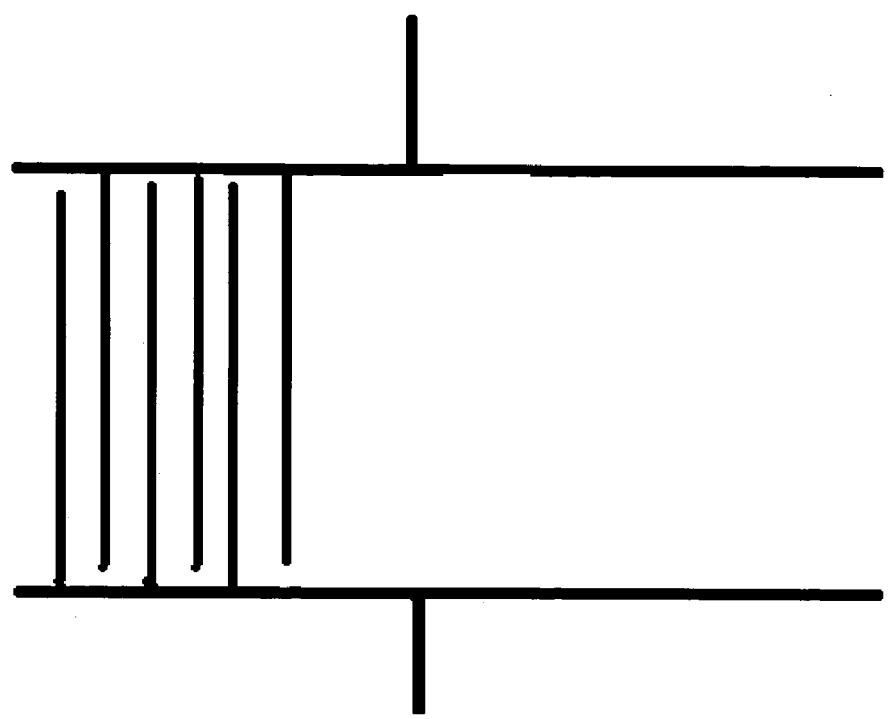
FIG. 10 illustrates a arbitrary scale capacitor design with increased surface area.

FIG. 10 illustrates an arbitrary scale capacitor design with increased surface area. This type gross structure serves to increase volume charge storage. FIG. 10 exhibits some high angularities and can be considered a sharpy structure.

Figure 11:
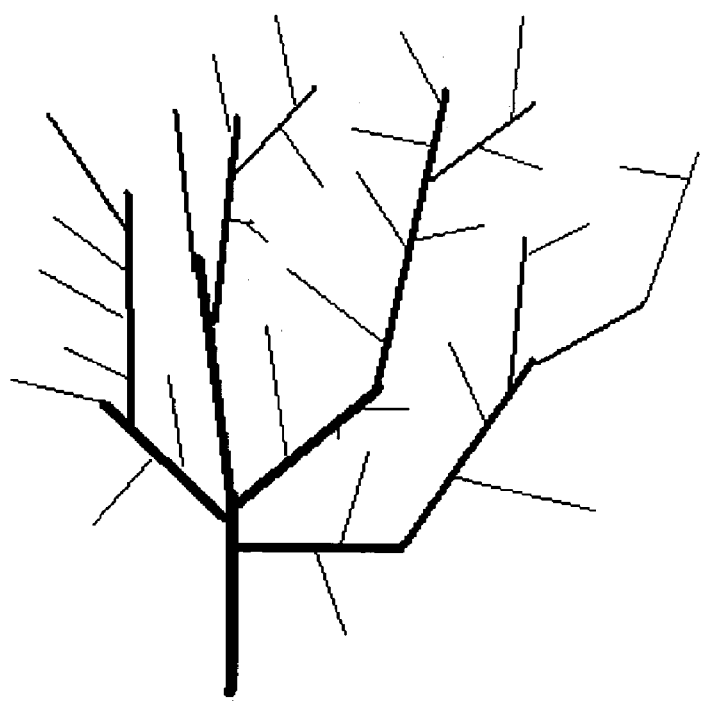
FIG. 11 illustrates a nanostructure with high angularity.

FIG. 11 illustrates a structure with high angularity: In certain embodiments the inventive electrical charge storage device utilizes a dendrite structure which tends to maximize the charge accumulation and energy storage. Dendrite structures include tree and leaf, nerve and synapse, blood vessel and capillary. Such sharpy structures are suitable for high energy density capacitors.

Figure 12:
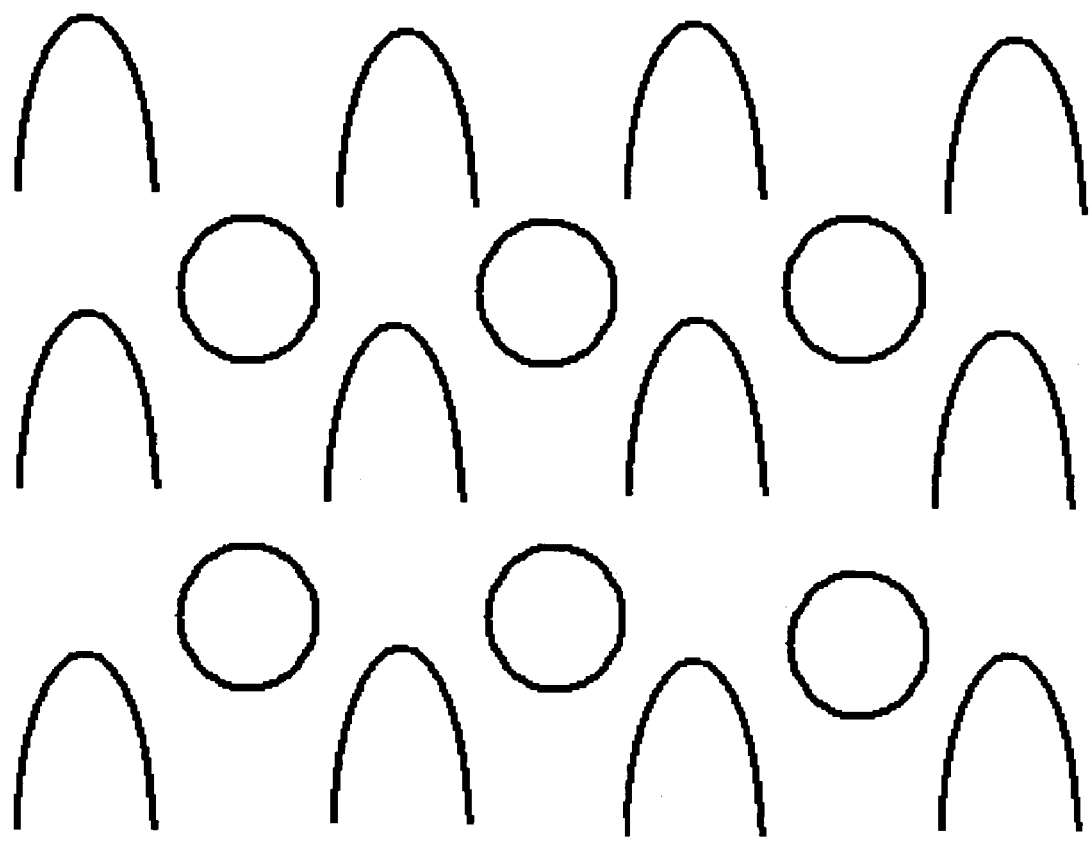
FIG. 12 illustrates an expanded surface area having a sinusoidal topology.

FIG. 12 illustrates an expanded surface area where $Z=A Sin(bX)Sin(bY)$, a sinusoidal topology. In certain embodiments, the conductive and dielectric layers utilize curvilinear surfaces. For the case of a continuous simple mathematical surface such as $Z=A[Sin(bX)Sin(bY)]$ the integral can be derived exactly. The surface area increase of the above surface is a function of the Amplitude A and the Period of bX and bY. In this figure, the period of bX and bY are identical. An object having a smooth curvilinear surface such as this, in which a conformal dielectric and second conformal conductive layer, can be shown to have great physical strength relative to the brittle structures present in electrolytic capacitors. The line integral (length) of a unit sinusoid over the period has a length of $2\pi$. Thus the surface integral for the sinusoidal unit structure is $4\pi^2$. The more general case of Z as shown above includes the constants A and b. The surface area would increase in direct proportion with the magnitude of the constant A, and increase in inverse proportion to the constant b due to the mathematical properties of surface integrals. This surface area increase is physically analogous to the increase in energy with increases in wave magnitude and decreases in wavelength (increasing frequency). The $Z=A Sin(bX)Sin(bY)$ a sinusoidal topology is smooth and can exhibit significant physical strength due to the conductors. A strongly bonded, physically strong, conformal dielectric will fill the separating space, providing significant mechanical support. A dielectric with good heat transfer characteristics and heat durability, such as the crystalline form of carbon (diamond) will allow a large displacement current. The conformal layer topology provides for the shortest distance for charge displacement within the dielectric to be an orthogonal path from conductor to conductor at each point of the curvilinear surfaces. Thus material strength, topology, and thermodynamic properties combine with dielectric constant and dielectric strength to determine the allowable transient and steady state current densities for a capacitor. Where structure dimensions are large relative to the atoms and molecules involved, a close approximation to uniform, conformal coating can be maintained.

Figure 13:
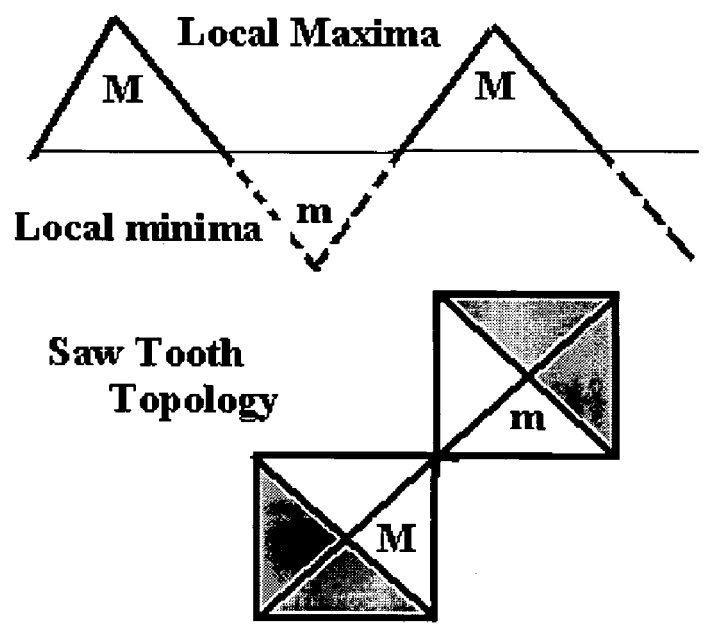
FIG. 13 illustrates an expanded surface area region where the peaks and valleys are rectangular parallelopiped in nature, exhibiting a unit saw tooth or pyramidal topology.

FIG. 13 illustrates an expanded surface area region where the peaks and valleys are rectangular parallelepiped in nature, exhibiting a unit saw tooth or pyramidal topology. In certain embodiments of the electrical charge storage device, conductive and dielectric surfaces have expanded surface regions. The line integral of a saw tooth 2D curve is 4, while the surface area of the 3D surface is six (6): Thus the 3D saw tooth topology exhibits six times the surface area of a flat surface but significantly less surface area than the sinusoidal topology. This shape can be described as tilted square box halves, slightly displaced. The topology structure of FIG. 13 exhibits significant physical strength combined with an increase in surface area. As in the case of the sinusoidal topology above, the pyramidal structure will increase in surface area with increasing amplitude and frequency. Also, the displacement current vector generally retains the orthogonal and shortest route characteristic of the sinusoidal structure above. The relatively straight realizable surfaces and edges are consistent with crystalline and polycrystalline growth structures.

All patents and publications mentioned in the specification are indicative of the level of those skilled in the art to which the invention pertains. All patents and publications are herein incorporated by reference to the same extent as if each individual publication was specifically and individually indicated to be incorporated by reference.

United States Patent Documents:
U.S. Pat. No. 5,362,526, entitled "Plasma-Enhanced CVD Process Using TEOS for Depositing Silicon Oxide", which is incorporated by reference herein.
U.S. Pat. No. 5,876,787, entitled "process of manufacturing a porous carbon material and capacitor having the same", Avarbz et al, 1999
U.S. Pat. No. 5,081,559, entitled "enclosed ferroelectric stacked capacitor", Fazan et al, 1992

Published United States Patent Applications:
US PTO 20020017893 W. B. Duff, Jr. Published Feb. 14, 2002 Method and Circuit For Using Polarized Device In AC Applications
US PTO 20030006738 W. B. Duff, Jr. Published Jan. 9, 2003 Method and Circuit For Using Polarized Device In AC Applications
Non-provisional U.S. application Ser. No. 09/170,998, entitled "Method and Circuit for Using Polarized Device in AC Applications," filed Nov. 9, 2000, which claims the benefit of provisional Application Ser. No. 60/174,433, entitled "Method and Circuit for Using Polarized Device in AC Applications," filed: Jan. 4, 2000.
USPTO 20030010910 Colbert, Daniel T., et al Published Jan. 9, 2003 Continuous Fiber of Single Wall Carbon Nanotubes Other References:
Solid State Electronic Devices, $3^{rd}$ Edition, Ben G. Streetman, Prentice-Hall, Englewood Cliffs, N.J., 1990.
Economic AC Capacitors, W. B. Duff, Jr., IEEE Power Engineering Review, Volume 22, Number 1, January 2002, The Institute of Electrical and Electronics Engineers, NY N.Y.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrical charge storage device, comprising:
   at least one first conductive layer having a conductive curvilinear surface;
   at least one second conductive layer having a conductive curvilinear surface positioned substantially parallel to the conductive curvilinear surface of the first conductive layer; and
   at least one dielectric layer disposed between the first conductive curvilinear surface and the second conductive curvilinear surface.

2. The electrical charge storage device as recited in claim 1, wherein the dielectric layer has opposing first and second dielectric curvilinear surfaces, the first dielectric curvilinear surface is disposed proximate the first conductive curvilinear surface and substantially following the first conductive curvilinear surface across its area.

3. The electrical charge storage device as recited in any one of claims 1 or 2 a second conductive layer having a second conductive curvilinear surface, the second conductive curvilinear surface disposed adjacent the second dielectric curvilinear surface and substantially following the second dielectric curvilinear surface across its area.

4. The electrical charge storage device as recited in any one of claims 1 or 2, wherein the first conductive surface and first dielectric surface are substantially conformal.

5. The electrical charge storage device as recited in any one of claims 1 or 2, wherein the second conductive surface and second dielectric surface are substantially conformal.

6. The electrical charge storage device as recited in any one of claims 1 and 2, wherein the first conductive surface substantially maintains moiety with the first dielectric surface.

7. The electrical charge storage device as recited in any one of claims 1 and 2, wherein the second conductive surface substantially maintains moiety with the second dielectric surface.

8. The electrical charge storage device as recited in any one of claims 1 and 2, wherein at least 2% of the first conductive surface area being substantially conformal with an area of the first dielectric surface.

9. The electrical charge storage device as recited in any one of claims 1 and 2, wherein at least 2% of the first conductive surface area substantially maintains moiety with an area of the first dielectric surface.

10. The electrical charge storage device as recited in any one of claims 8, wherein the first conductive surface area being disposed at a substantially uniform distance from the first dielectric surface area.

11. The electrical charge storage device as recited in any one of claims 8 wherein the first conductive surface area being disposed at a selected distance ranging from 0.0001 μm to 2000 μm from the first dielectric surface area, said selected distance varying within a selectable tolerance.

12. The electrical charge storage device as recited in any one of claims 1 and 2, wherein at least 2% of the second conductive surface area being substantially conformal with an area of the second dielectric surface.

13. The electrical charge storage device as recited in any one of claims 1 and 2, wherein at least 2% of the second conductive surface area substantially maintains moiety with an area of the second dielectric surface.

14. The electrical charge storage device as recited in any one of claims 12, wherein the second conductive surface area being disposed is at a substantially uniform distance from the second dielectric surface area.

15. The electrical charge storage device as recited in any one of claims 12, wherein the second conductive surface area being disposed at a selected distance ranging from 0.0001 μm to 2000 μm from the second dielectric surface area, said selected distance varying within a selectable tolerance.

16. The electrical charge storage device as recited in any one of claims 1 and 2, wherein each of the first and the second conductive curvilinear surfaces and the dielectric curvilinear surface have a substantially smooth structure.

17. The electrical charge storage device as recited in claim 16, wherein each of the first and the second conductive curvilinear surfaces and the dielectric curvilinear surface comprises a villous structure formed on at least a portion of the smooth structure of any of the surfaces, the villous structure having a small scale relative to the smooth structure.

18. The electrical charge storage device as recited in claims 16, wherein each of the first and the second conductive curvilinear surfaces and the dielectric curvilinear surface comprises a dendritic structure formed on at least a portion of the smooth structure of any of the surfaces, the dendritic structure having a small scale relative to the smooth structure.

19. The electrical charge storage device of claim 1, wherein:
   the curvilinear surface of the first conductive layer is a smooth, enhanced surface;
   the dielectric layer has opposing first and second dielectric surfaces, the first dielectric surface disposed proximate the smooth, enhanced surface of the first conductive layer and substantially following the smooth, enhanced surface of the first conductive layer; and
   the curvilinear surface of the second conductive layer is a smooth, enhanced surface, the smooth, enhanced surface of the second conductive layer disposed adjacent the second dielectric surface and substantially following the second dielectric surface.

20. The electrical charge storage device as recited in claim 19, wherein the first dielectric smooth, enhanced surface disposed proximate the first conductive smooth, enhanced surface and substantially following the first conductive smooth, enhanced surface.

21. The electrical charge storage device as recited in any one of claims 19 and 20, wherein the first conductive surface and first dielectric surface are substantially conformal.

22. The electrical charge storage device as recited in any one of claims 19 and 20, wherein the second conductive surface and second dielectric surface are substantially conformal.

23. The electrical charge storage device as recited in any one of claims 19 and 20, wherein the first conductive surface substantially maintains moiety with the first dielectric surface.

24. The electrical charge storage device as recited in any one of claims 19 and 20, wherein the second conductive surface substantially maintains moiety with the second dielectric surface.

25. The electrical charge storage device as recited in any one of claims 19 and 20, wherein at least 2% of the first conductive surface area being substantially conformal with an area of the first dielectric surface.

26. The electrical charge storage device as recited in any one of claims 19 and 20, wherein at least 2% of the first conductive surface area substantially maintains moiety with an area of the first dielectric surface.

27. The electrical charge storage device as recited in any one of claims 25, wherein the first conductive surface area being disposed at a substantially uniform distance from the first dielectric surface area.

28. The electrical charge storage device as recited in any one of claims 25, wherein the first conductive surface area being disposed at a selected distance ranging from 0.0001 μm to 2000 μm from the first dielectric surface area, said selected distance varying within a selectable tolerance.

29. The electrical charge storage device as recited in any one of claims 19 and 20, wherein at least 2% of the second conductive surface area being substantially conformal with an area of the second dielectric surface.

30. The electrical charge storage device as recited in any one of claims 19 and 20, wherein at least 2% of the second conductive surface area substantially maintains moiety with an area of the second dielectric surface.

31. The electrical charge storage device as recited in any one of claims 29, wherein the second conductive surface area being disposed at a substantially uniform distance from the second dielectric surface area.

32. The electrical charge storage device as recited in any one of claims 19 and 20, wherein each of the first and the second conductive smooth, enhanced surfaces and the dielectric smooth enhanced surface have a substantially smooth structure.

33. The electrical charge storage device as recited in claim 32, wherein each of the first and the second conductive smooth enhanced surfaces and the dielectric smooth enhanced surface comprises a villous structure formed on at least a portion of the smooth structure on any of the surfaces, the villous structure having a small scale relative to the smooth structure.

34. The electrical charge storage device as recited in claim 32, wherein each of the first and the second conductive smooth enhanced surfaces and the dielectric conductive smooth enhanced surfaces comprises a dendritic structure formed on at least a portion of the smooth structure on any of the surfaces, the dendritic structure having a small scale relative to the smooth structure.

35. The electrical charge storage device of claim 1, wherein,:
the curvilinear surface of the first conductive layer is a shaped topographical surface;
the curvilinear surface of the second conductive layer is a conductive shaped topographical surface; and
the dielectric layer is disposed between the shaped topographical surfaces of the first and second conductive layers.

36. The electrical charge storage device as recited in claim 35, wherein the dielectric layer has opposing first and second dielectric topographical surfaces, the first dielectric topographical surface is disposed proximate the first conductive topographical surface and substantially following the first conductive topographical surface across its area.

37. The electrical charge storage device as recited in any one of claims 35, wherein the first conductive surface and first dielectric surface are substantially conformal.

38. The electrical charge storage device as recited in any one of claims 35, wherein the second conductive surface and second dielectric surface are substantially conformal.

39. The electrical charge storage device as recited in any one of claims 35, wherein the first conductive surface substantially maintains moiety with the first dielectric surface.

40. The electrical charge storage device as recited in any one of claims 35, wherein the second conductive surface substantially maintains moiety with the second dielectric surface.

41. The electrical charge storage device as recited in any one of claims 35, wherein at least 2% of the area of the first conductive surface has a shaped topographical surface, said 2% area defining a smooth structure.

42. The electrical charge storage device as recited in any one of claims 35, wherein at least 2% of area of the second conductive surface has a shaped topographical surface, said 2% area defining a smooth structure.

43. The electrical charge storage device as recited in any one of claims 41, wherein at least 2% of the area of the first dielectric surface has a shaped topographical surface, said 2% area defining a smooth structure.

44. The electrical charge storage device as recited in any one of claims 41, wherein at least 2% of area of the second dielectric surface has a shaped topographical surface, said 2% area defining a smooth structure.

45. The electrical charge storage device as recited in any one of claims 41, wherein at least 2% of the first conductive surface area being substantially conformal with an area of the first dielectric surface.

46. The electrical charge storage device as recited in any one of claims 41, wherein at least 2% of the first conductive surface area substantially maintains moiety with an area of the first dielectric surface.

47. The electrical charge storage device as recited in any one of claims 43, wherein the first conductive surface area being disposed at a substantially uniform distance from the first dielectric surface area.

48. The electrical charge storage device as recited in any one of claims 43, wherein the first conductive surface area being disposed at a selected distance ranging from 0.0001 μm to 2000 μm from the first dielectric surface area, said selected distance varying within a selectable tolerance.

49. The electrical charge storage device as recited in any one of claims 41, wherein at least 2% of the second conductive surface area being substantially conformal with an area of the second dielectric surface.

50. The electrical charge storage device as recited in any one of claims 41, wherein at least 2% of the second conductive surface area substantially maintains moiety with an area of the second dielectric surface.

51. The electrical charge storage device as recited in any one of claims 49, wherein the second conductive surface area being disposed at a substantially uniform distance from the second dielectric surface area.

52. The electrical charge storage device as recited in any one of claims 49, wherein the second conductive surface area being disposed at a selected distance ranging from 0.0001 μm to 2000 μm from the second dielectric surface area, said selected distance varying within a selectable tolerance.

53. The electrical charge storage device as recited in any one of claims 41, wherein each of the first and the second conductive surfaces and the dielectric surface have a substantially smooth structure.

54. The electrical charge storage device as recited in claim 53, wherein each of the first and the second conductive surfaces and the dielectric surface comprises a villous structure formed on at least a portion of the smooth structure of any of the surfaces, the villous structure having a small scale relative to the smooth structure.

55. The electrical charge storage device as recited in claims 53, wherein each of the first and the second conductive surfaces and the dielectric surface comprises a dendritic structure formed on at least a portion of the smooth structure of any of the surfaces, the dendritic structure having a small scale relative to the smooth structure.

56. The electrical charge storage device of any one of claims 16 wherein at least a portion of the smooth structure has a repeating pattern.

57. The electrical charge storage device of any one of claims 16 wherein at least a portion of the smooth structure of the first and/or second conductive layer has an area that is alveolar in shape, sinusoidal rows in shape, parabolic in shape, inverted in shape, evened in shape, concave in shape, convex in shape, spiral in shape, random swirl in shape, quasi-random swirl in shape, mathematically defined as (A)sin(bX)sin(bY), mathematically defined as parabolic, mathematically defined as conical, tubular in shape, annular in shape, or toroidal in shape, or embedded in a permeable vertical fashion.

58. The electrical charge storage device of any one of claims 16 wherein at Least a portion of the smooth structure of the dielectric layer has an area that is alveolar in shape, sinusoidal rows in shape, parabolic in shape, inverted in shape, evened in shape, concave in shape, convex in shape, spiral in shape, random swirl in shape, quasi-random swirl in shape, mathematically defined as (A)sin(bX)sin(bY), mathematically defined as parabolic, mathematically defined as conical, tubular in shape, annular in shape, toroidal in shape, or embedded in a permeable vertical fashion.

59. The electrical charge storage device of claim 1, wherein:
the dielectric layer has opposing first and second dielectric surfaces, the first dielectric disposed proximate the conductive curvilinear surface of the first conductive layer and substantially following the first curvilinear surface;
the conductive curvilinear surface of the second conductive layer disposed adjacent the second dielectric surface and substantially following the second dielectric surface; and
wherein at least a portion of the first and/or second dielectric surfaces have sharpy structures.

60. The electrical charge storage device of claim 59, wherein at least 2% of the surface area of the first and/or second dielectric layer have sharpy structures.

61. The electrical charge storage device according to any one of claims 59-60, wherein the similar shapes of sharpy structures are repetitively patterned across the at least 2% surface area.

62. The electrical charge storage device according to any one of claims 59-60, wherein the different shapes of sharpy structures are repetitively patterned across the at least 2% surface area.

63. The electrical charge storage device of claim 59, wherein at least a portion of the first and/or second conductive surfaces has sharpy structures.

64. The electrical charge storage device as recited in any one of claims 59, wherein the sharpy structure is a dendrite structure.

65. The electrical charge storage device as recited in claim 64, wherein the dendrite structure is a substantially tree and leaf structure, a substantially nerve-like structure, a substantially a synapse-like structure, or a substantially a blood vessel and capillary-like structure.

* * * * *